(12) United States Patent
Gerber

(10) Patent No.: US 6,605,354 B1
(45) Date of Patent: Aug. 12, 2003

(54) HIGH NITROGEN CONTAINING TRIAZINE-PHENOL-ALDEHYDE CONDENSATE

(75) Inventor: Arthur H. Gerber, Louisville, KY (US)

(73) Assignee: Borden Chemical, Inc., Columbus, OH (US)

(*) Notice: Subject to any disclaimer, the term of this patent is extended or adjusted under 35 U.S.C. 154(b) by 0 days.

(21) Appl. No.: 09/940,961

(22) Filed: Aug. 28, 2001

(51) Int. Cl.$^7$ .......... B32B 27/38; B32B 27/04; C08L 63/00; C08G 14/06

(52) U.S. Cl. .......... 428/413; 428/297.4; 428/320.2; 525/480; 525/481; 528/163

(58) Field of Search .......... 528/86, 96, 99, 528/210, 163; 525/523, 481, 534, 480; 428/413, 297.4, 320.2

(56) References Cited

U.S. PATENT DOCUMENTS

| | | | |
|---|---|---|---|
| 2,197,357 A | 4/1940 | Widmer et al. | 260/72 |
| 2,310,004 A | 2/1943 | Widmer et al. | 260/9 |
| 2,328,592 A | 9/1943 | Widmer et al. | 260/72 |
| 4,005,036 A | 1/1977 | Stalego | 260/2.5 F |
| 4,046,734 A | 9/1977 | Zimmerli | 260/38 |
| 4,108,822 A | 8/1978 | Edwards et al. | 260/32.8 R |
| 4,611,020 A | 9/1986 | Bornstein et al. | 524/233 |
| 4,785,073 A | 11/1988 | Farkas et al. | 528/163 |
| 5,322,915 A | 6/1994 | Weiser et al. | 528/163 |
| 5,939,515 A | 8/1999 | Guenther et al. | 528/254 |
| 5,952,447 A * | 9/1999 | Ikeda | 528/163 |
| 5,955,184 A | 9/1999 | Honda et al. | 428/299.4 |
| 6,031,064 A | 2/2000 | Guenther et al. | 528/254 |
| 6,214,455 B1 | 4/2001 | Honda | 428/299.4 |
| 6,392,003 B1 * | 5/2002 | Kiuchi et al. | 528/163 |
| 2001/0031851 A1 * | 10/2001 | Fukuzawa et al. | 528/96 |

FOREIGN PATENT DOCUMENTS

EP  0 877 040 B1  12/2000 ........ C08G/14/10

OTHER PUBLICATIONS

S.R. Sandler, et al., Polymer Synthesis, vol. 2, p22–27 and 32–35, Academic Press, N.Y. 1977.
Abstract of Japanese Patent Document 1,266,859 of Sep. 2000.
Abstract of Japanese Patent Document 2001139666 (Kokai) of May 2001.
Abstract of Japanese Patent Document 11279248–A of Oct. 1999.
Abstract of Japanese Patent Document 11279247–A of Oct. 1999.
Abstract of Japanese Patent Document 10279657–A of Oct. 1998.
Abstract of Japanese Patent Document 08311142–A of Nov. 1996.
Abstract of Japanese Patent Document 08183827–A of Jul. 1996.
Abstract of WO Patent Document 00009579–A1 of Feb. 2000.
Abstract of WO Patent Document 00151562–A1 of Jul. 2001.
Abstract of Japanese Patent Document 00136292 of May 2000.
Abstract of Japanese Patent Document 00129091 of May 2000.

* cited by examiner

*Primary Examiner*—Robert Dawson
*Assistant Examiner*—Michael J Feely
(74) *Attorney, Agent, or Firm*—George P. Maskas; Kenneth P. Van Wyck

(57) ABSTRACT

There is disclosed a triazine-phenol-aldehyde condensate which contains at least 15% of nitrogen, has a melt viscosity of not greater than 2,000 cps at 175° C. and a solubility of at least 80% by weight at 25° C. by the 90:10 methanol-:water method. Also disclosed are methods for the manufacture of the condensate as well as its use in fire-retardant epoxy resin compositions suitable for the manufacture of laminates for electronic applications. Additionally, disclosed is a composition comprising a physical mixture of a triazine-phenol-aldehyde condensate with benzoguanamine and/or acetoguanamine wherein the mixture contains from about 0.5% to 20% of benzoguanamine, acetoguanamine and mixtures thereof based on the weight of the condensate. There is also disclosed a glycidylated triazine-phenol-aldehyde condensate of this invention.

27 Claims, No Drawings

HIGH NITROGEN CONTAINING TRIAZINE-PHENOL-ALDEHYDE CONDENSATE

This invention relates to a high nitrogen containing triazine-phenol-aldehyde (T-P-A) condensate which has a low melt viscosity.

The high nitrogen, e.g., 15%–23%, condensate of this invention is an effective curing agent and also provides fire-retardant properties to epoxy compositions. The low melt viscosity of the condensate affords reduced viscosity solutions with better wetting of re-enforcement materials such as glass cloth and fiber, thereby providing composites, e.g., laminates, for printed wire boards with superior properties. The condensate of this invention is also suitable in the manufacture of molded products as well as for other uses enjoyed by phenolic novolac resins.

BACKGROUND AND PRIOR ART

As flame-retardants for epoxy as well as other resins, addition-type flame retardants such as low molecular weight halides, antimony trioxide and phosphorus compounds are often used. However, such addition type flame-retardants not only adversely influence the properties of the resins to which the flame retardants are added but can cause problems due to their toxicity. More recently halogenated polyhydroxystyrene as well as certain triazine-phenol-aldehyde (T-P-A) condensates have been described as flame retardant additives for epoxy resins. However, the halogenated polymers give off hydrogen halides during a fire whereas the T-P-A condensates have a number of shortcomings.

A major shortcoming of the prior art T-P-A condensates is their high melt viscosity and low nitrogen content. Illustratively, T-P-A condensates used as flame retardants with epoxy resins in both U.S. Pat. Nos. 5,955,184 and EP 0877040 B1 have melt viscosities which are significantly higher than those of the instant invention and nitrogen contents which are below those of the instant invention.

SUMMARY OF THE INVENTION

In one aspect, this invention is directed to the preparation of a triazine-phenol-aldehyde (T-P-A) condensate which has a melt viscosity of less than about 2,000 cps at 175° C. and contains at least 15% by weight of nitrogen. Such a novel condensate can be prepared by any one of the following four methods.

(1) A first method referred to herein as the high basicity amine catalyst method which comprises the following:
  (a) Charging to a reaction vessel, a triazine, about 6 to 12 moles of a phenol for each mole of triazine, from about 0.1% to 2% of a secondary or tertiary amine having a pK basicity of at least 10, and about 2.2 to 3.5 moles of formaldehyde for each mole of triazine to form a reaction mixture. The quantity of the amine is based on the weight of phenol charged to the reaction mixture.
  (b) Heating the reaction mixture at a temperature of about 40° C. to about 120° C. until the reaction mixture is substantially free of formaldehyde wherein the triazine is a member selected from the group consisting of melamine, a mixture of melamine with benzoguanamine wherein the quantity of benzoguanamine is not more than about 50% by weight of the mixture, a mixture of melamine and acetoguanamine wherein the quantity of acetoguanamine is not more than about 50% by weight of the mixture, and a mixture of melamine, benzoguanamine, and acetoguanamine wherein the quantity of benzoguanamine is not greater than about 35% by weight of the mixture, the acetoguanamine is not greater than about 35% by weight of the mixture and the melamine is at least 50% by weight of the mixture, wherein said phenol is a member selected from the group consisting of phenol itself, an alkyl phenol wherein the alkyl has from 1 to 4 carbon atoms substituted in the meta-position of the phenol, a meta-substituted alkoxy phenol having from 1 to 4 carbon atoms in the alkoxy group, and a mixture of phenol itself, the meta-substituted alkyl phenol and the meta-substituted alkoxy phenol; and
  (c) after reaction of substantially all of the formaldehyde, heating the reaction mixture at a temperature of at least about 100° and reacting phenol in the reaction mixture until reaction of the phenol is substantially completed.

(2) A second method is referred to herein as the low basicity amine catalyst method.
  (a) This method charges to a reactor the same quantities of triazine, phenol, formaldehyde and amine as in method (1) above to form a reaction mixture but the amine catalyst has a pK basicity value of less than 10 and the reaction mixture is heated at a temperature of about 40° C. to 80° C. to react the formaldehyde.
  (b) After the reaction mixture is substantially free of formaldehyde an acid having a pK acidity value of about 0.5 to 3.8 in an amount of about 2% to 4% by weight of the reaction mixture is added to the mixture in those instances wherein the reaction mixture does not contain at least 1.5% by weight of the triazine reactant of benzoguanamine and/or acetoguanamine. When the triazine charge contains such quantity of benzoguanamine and/or acetoguanamine such acid addition is not needed. The reaction mixture is then heated at a temperature of at least about 100° C. until reaction of the phenol is substantially completed.

(3) A method referred to herein as the low temperature acid catalyst method.
  (a) This method uses the same quantities of triazine, phenol and formaldehyde as in methods (1) and (2). Instead of an amine catalyst, the catalyst is that of an acid in a quantity of about 0.05% to about 0.3%, based on the weight of phenol, wherein the acid has a pK acidity value of about 0.5 to 3.8.
  (b) The aldehyde content in the reaction mixture is reacted at a temperature of not higher than about 80° C., e.g., from about room temperature when the catalyst is formic acid or the phenol is liquified with water or formalin. Preferably the reaction mixture is heated at a temperature of not higher than about 80° C. such as that of about 40° C. to about 70° C. until the mixture is substantially free of aldehyde. After the reaction mixture is substantially free of aldehyde, about 2.0% to 4.0% by weight of the reaction mixture of an acid having a pK acidity of abut 0.5 to 3.8 is added to the reaction mixture, at a temperature of the reaction mixture of not higher than about 80° C. such as that of about 50° C. to 80° C. and preferably at a temperature of about 50° C. to about 70° C.
  (d) The temperature of the reaction mixture is then raised to at least about 100° C. until reaction of the phenol is substantially complete.

(4) A fourth method is referred to herein as the high temperature acid catalyst method.
  (a) The same quantities of triazine and phenol as in the previous three methods are charged to a reactor to form the reaction mixture. However, about 0.2% to 2% of an acid catalyst having a pK acidity of about 0.5 to about 3.8 is charged to the reaction mixture as well as only about one half of the total amount of the total quantity of 2.2 to 3.5 moles of formaldehyde for each mole of triazine.

(b) The reaction mixture is heated at a temperature of about 70° C. to 110° C. until the mixture is substantially free of formaldehyde.

(c) After the reaction mixture is substantially free of formaldehyde, the reaction mixture is heated to a temperature of about 120° to 160° C. for about 0.5 to 2.5 hours.

(d) The reaction mixture is then cooled to a temperature which does not exceed about 110° C. such as that of about 80° C. to 110° and the remainder of the formaldehyde is added;

(e) The reaction mixture is then heated to a temperature of above about 120° C. until reaction of the phenol is substantially complete.

In place of the aldehyde being substantially all formaldehyde, the above methods also comprise the substitution of up to about 20 mole percent of the formaldehyde with an equal molar quantity of another aldehyde.

In another aspect, this invention is directed to the condensate prepared by the above described methods.

In still another aspect, this invention provides a composition comprising a high (at least 15%) nitrogen containing triazine-phenol-aldehyde (T-P-A) condensate with melt viscosity up to about 2,000 cps at 175° C. and a solubility at about 25° C. of at least 80% by weight by the 90:10 methanol:water solvent method.

In yet another aspect, this invention provides a method for lowering the melt viscosity of any T-P-A condensate by physically mixing a T-P-A condensate with from about 0.5% to 20% by weight of benzoguanamine and/or acetoguanamine as well as the compositions prepared therefrom.

In yet another aspect of this invention, the triazine-phenol-aldehyde condensate of this invention either alone or in admixture with another epoxy curing agent and/or another fire-retardant can be used as a fire-retardant curing agent for epoxy resins.

In another aspect, this invention provides a prepreg of a porous substrate comprising a curable epoxy resin and a T-P-A condensate of this invention as the curing agent alone or in combination with another curing agent.

In another aspect, this invention is directed to a laminate comprising a plurality of prepregs impregnated with an epoxy resin and a T-P-A condensate of this invention alone or together with another curing agent wherein the epoxy resin composition is cured.

In another aspect, this invention is directed to curable epoxidized compositions of the T-P-A condensate of this invention.

DETAILED DESCRIPTION OF THE INVENTION

The Phenol Monomer

The phenol monomer, also, simply referred to as a phenol can be phenol itself, a meta-alkyl phenol having from 1 to 4 carbon atoms, a meta-alkoxy phenol having from 1 to 4 carbon atoms and mixtures thereof. Illustrative of a phenol there can be mentioned: phenol itself; meta-cresol; 3-ethyl phenol; 3-isopropyl phenol; 3-methoxy phenol; 3-ethoxy phenol; etc. Phenol itself is the preferred phenol monomer. The quantity of a phenol charged to the reactor in the manufacture of the condensate of this invention is from about 6 to 12 moles of a phenol for each mole of triazine.

Preferably, 7 to 10 moles of a phenol are charged for each mole of the triazine. Also preferred is a mixture of at least 90% by weight of phenol itself and not more than 10% by weight of the alkyl phenol, alkoxy phenol and mixtures of the alkyl phenol and alkoxy phenol. The quantity of phenol charged to the reactor is much greater than the amount which reacts in the formation of the condensate so that free, unreacted, phenol is typically distilled out of the reaction mixture after completion of the reactions.

The Triazine Monomer

The triazine monomer can be: (a) melamine; (b) a mixture of melamine and benzoguanamine wherein the quantity of melamine is at least 50% by weight of the mixture and the benzoguanamine is from about 0.5% to not more than about 50% by weight of the mixture and preferably wherein the amount of benzoguanamine is from about 1% to not more than about 25% by weight of the mixture; (c) a mixture of melamine and acetoguanamine wherein the quantity of melamine is at least 50% by weight of the mixture and the acetoguanamine is from about 0.5% to not more than about 50% by weight of the mixture and preferably wherein the acetoguanamine is from about 1% to not more than 25% by weight of the mixture and the remainder is melamine; and (c) a mixture of melamine, benzoguanamine and acetoguanamine wherein the benzoguanamine is not more than about 35% by weight of the mixture, the acetoguanamine is not more than 35% by weight of the mixture and the quantity of melamine is at least 50% by weight of the mixture and particularly wherein the benzoguanamine and acetoguanamine combined are not more than 25% by weight of the mixture and the melamine is at least 75% by weight of the mixture.

The Aldehyde Monomer

The aldehyde monomer is preferably formaldehyde. However, up to about 20 mole % and preferably up to about 10 mole % of the formaldehyde can be replaced with other aldehydes. Illustrative of other aldehydes there can be mentioned: acetaldehyde, i-butyraldehyde, benzaldehyde; acrolein, crotonaldehyde and mixtures thereof. The term "aldehyde" herein includes not only the aldehydes themselves, but also compounds yielding aldehydes, e.g., paraformaldehyde, trioxymethylene, paraldehyde and the like. The aldehyde may be introduced neat or as a 20% to 50% solution in phenol to facilitate metering in the reaction mixture. However, the formaldehyde is generally charged to the reaction mixture as 50% formalin. Formalin generally contains small quantities of formic acid with about 0.03% of formic acid being typical in a 50% formalin solution.

The quantity of aldehyde used in manufacture of the condensate of this invention varies from about 2.2 to 3.5 moles and particularly about 2.5 to 3.0 moles for each mole of the triazine charged to the reactor.

The Amine Catalyst

The amine catalyst can be a secondary or tertiary amine. The quantity of amine catalyst, also referred to as a catalytically effective quantity of amine catalyst, will typically vary from abut 0.1% to abut 2% based on the weight of the phenol charged and preferably about 0.25% to 1%.

In the high basicity amine catalyst method, the amine will have a pK basicity of at least 10 such as that of 10 to 11.5. In the low basicity amine catalyst method, the pK basicity will be less than 10 such as about 7 to 9.

Illustrative of aliphatic, cycloaliphatic, and heterocyclic amines having a pK basicity of 10 or more which can be used in this invention, there can be mentioned the following. Tertiary amines of the formula $R_3N$ wherein each R is selected from alkyl having one to seven carbon atoms and wherein the nitrogen can be part of a heterocyclic ring. In this regard, each of the alkyl groups can be the same or different. Illustrative of specific tertiary amines, the following can be mentioned. Triethylamine which has a pK basicity of 10.72, tributylamine which has a pK basicity of 10.3, various N-lower alkyl piperidines wherein the alkyl group has from 1 to 4 carbon atoms, e.g., N-ethyl piperidine which has a pK basicity of 10.45, 2-di(n-butylamino)ethanol which has a pK basicity of 9.8, 2-di(isopropylamino) ethanol which has a pK basicity of 9.8, N-methylpyrrolidine which has a pK basicity of 10.32, and N,N-dimethyl cyclohexylamine which has a pK basicity of 10.72.

Illustrative of secondary amines having a pK of 10 or more there can be mentioned: various secondary amines of the formula $R_1R_2NH$ wherein each R is alkyl of 2 to 4 carbon atoms, e.g., diethylamine which as a pK basicity of 11.05, di-n-butylamine which has a pK basicity of 11.25 and diisopropylamine which has a pK basicity of 11.3; piperidine which has a pK basicity of 11.12; and pyrrolidine which has a pK basicity of 11.32.

Illustrative of amines having a pK basicity of less than 10 there can be mentioned: N-methylmorpholine which has a pK basicity of 7.13; N-methyl diethanolamine which has a pK basicity of 8.52; triethanolamine which has a pK basicity of 7.76; N,N'-dimethylpiperazine which has a pK basicity of 8.54; 4-methylpyridine which has a pK basicity of 6.03; 2,4-dimethylpyridine which has a pK basicity of 6.77; N,N-diethylaniline which has a pK basicity of 6.61; and N,N-dimethylbenzylamine which has a pK basicity of 9.02.

The Acid Catalyst

The methods of this invention for manufacture of the T-P-A condensate, except the high basicity amine catalyst method (i.e., wherein an amine with a basicity of 10 or greater is used), may use an acid which has a pK acidity value of about 0.5 to about 3.8. The preferred acids with this acidity value are oxalic, formic, and trifluoroacetic acid since they are easily removed from the reaction mixture, particularly in removal of water and the free phenol from the reaction mixture on completion of the condensation reactions. Other acids having the same acidity value such as lactic acid can be used but they can be difficult to remove from the reaction mixture since they do not distill out or decompose as easily.

In the case of oxalic acid as catalyst in the various methods of this invention, the temperature of the reaction mixture is raised above about 130° C. such as up to about 170° C. together with distillation and preferably when the temperature is raised to about 140° C. to about 160° C. so that the oxalic acid catalyst is decomposed to volatile components. Oxalic acid can be used in its various forms such as the pure compound, the dihydrate, or mixtures thereof, all of which are referred to as oxalic acid herein.

The Methods for Preparation of the T-P-A Condensate

In both acid processes for making the condensate, the pH of the mixture of phenol, aldehyde, and acid catalyst is less than 2.5 and generally less than 2. Addition of triazine buffers the pH to about 6 to 7 whereas by the addition of an amine catalyst in the absence of triazine, the pH is buffered by the large presence of phenol.

The various reaction steps for preparation of the condensate of this invention are generally conducted in the same reactor. An inert atmosphere, e.g., nitrogen, is optimally employed to minimize oxidation of aldehyde and discoloration of product. In the order of charging ingredients to the reactor, the aldehyde is typically added after the triazine, phenol and catalyst except in the low temperature acid catalyst method when it need not be added after the other ingredients. In each of the methods for the manufacture of the T-P-A condensate, when aldehydes other than formaldehyde are used, such other aldehydes are typically reacted at a temperature of not higher than about 100° C. prior to the addition of formaldehyde.

As mentioned hereinabove in the Summary of the Invention, applicant can prepare the T-P-A condensate by four different methods. In all of the methods, the molar ratio of the reactants is the same, namely, charging to a reactor, a triazine, about 6 to 12 moles of a phenol for each mole of triazine, and about 2.2 to 3.5 moles of aldehyde for each mole of triazine.

In the case of both the high basicity amine catalyst method wherein the pK basicity of the amine is at least 10 and the low basicity amine catalyst method wherein the basicity of the amine catalyst is less than 10, from about 0.1% to about 2% of the amine catalyst and preferably from about 0.25% to 1% of amine catalyst, based on the weight of phenol, is charged to the reaction mixture. In both methods, the amine is a secondary or tertiary amine.

The High Basicity Amine Catalyst Method

In the high basicity amine catalyst method, the amount of triazine, phenol and aldehyde charged in the reaction mixture are the same as in all the other methods of this invention for manufacture of the T-P-A condensate. The catalyst has a pK basicity of at least 10. After the ingredients have been charged to the reaction mixture, the mixture is heated at a temperature of about 40° C. to 120° C. and preferably from about 45° C. to about 85° C. until the reaction mixture is substantially free of aldehyde, i.e., the aldehyde has reacted. Following this step, the reaction mixture is heated at a temperature of at least 100° C., e.g., from about 100° C. to about 160° C. and preferably from about 110° C. to about 140° C. Until the phenol has substantially completely reacted, which typically takes about one to four hours.

The Low Basicity Amine Catalyst Method

In the low basicity amine catalyst method wherein the amine has a pK basicity of less than 10 such as about 7 to 9, the reaction mixture is heated at a temperature of about 40° C. to 80° C. and preferably about 50° C. to 70° C. Raising the temperature after reaction of the formaldehyde causes the reaction mixture to gel or produce a T-P-A condensate having a melt viscosity of more than 2,000 cps at 175° C. unless the triazine reactant includes at least 1.5% of benzoguanamine or acetoguanamine. To prevent the gelation or formation of an unacceptably high viscosity product, a small quantity of an acid having a pK acidity of about 0.5 to 3.8 is added to the reaction mixture at a reaction mixture temperature of not greater than about 80° C. Preferably, the reaction mixture is at temperature of about 40° C. to 80° C. and particularly at a temperature of about 50° C. to 80° C. at the time the acid is added. The quantity of such acid is about 2% to about 4% based on the weight of the reaction mixture. After the addition of the acid, the reaction mixture is heated at a temperature from about 80° C. to about 160° C. and preferably from about 100° C. to about 140° C. until the phenol has completely reacted in the reaction mixture.

The Low Temperature Acid Catalyst Method

In the case of the low temperature acid catalyst method, the initial reaction mixture includes an acid catalyst having a pK acidity of from about 0.5 to about 3.8 wherein the quantity of acid varies from about 0.05% to 0.3% based on the quantity of phenol charged. The quantities of triazine, phenol and aldehyde are the same as the high basicity amine catalyst method and the low basicity amine catalyst method. The aldehyde is charged to the reaction mixture and the reaction mixture is preferably heated at a temperature of about 40° to 80° C. and particularly at a temperature of about 45° C. to about 60° C. until the reaction mixture is substantially free of aldehyde. However the reaction of the aldehyde in this method can take place at a lower temperature range such as that of about 25° C. or slightly below when formic acid is the catalyst. After the reaction mixture is substantially free of aldehyde, an acid having a pK acidity of about 0.5 to about 3.8 in an amount of from about 2% to 4% of the reaction mixture is added to the reactor at a reaction mixture temperature of not greater than about 80° C., preferably at a temperature of about 50° C. to 80° C. The acid is added in those instances wherein the triazine charged does not contain at least 1.5% by weight of benzoguanamine and/or acetoguanamine. It should be noted that in this low temperature acid catalyst method, the aldehyde need not be charged after the other ingredients are charged: The reaction mixture is then heated at a temperature of at least 100° C. to about 160° C. and preferably about 100 to about 140° C. until the reaction of phenol in the reaction medium is substantially complete.

The High Temperature Acid Catalyst Method

In the case of the high temperature acid catalyst method, only about half of the aldehyde is charged initially. The acid catalyst will have a pK acidity of about 0.5 to 3.8 in a quantity of about 0.2% to about 2% based preferably about 0.7% to 2% when the acid is formic and about 0.3% to 1% when the acid is oxalic or trifluoroacetic. The quantity of acid is based on the weight of phenol charged to the reaction mixture. A mixture of the phenol, acid and aldehyde will have a pH of less than 2.5 and preferably less than 2 when measured by the procedure shown in Table 10 hereinafter. The initial heating for reaction of the aldehyde is at a temperature of about 70° C. to about 110° C. and preferably about 80° C. to 105° C. It is preferred that the aldehyde be added in this initial heating in portions such as about 2 to 4 portions. After the reaction mixture is substantially free of aldehyde, the reaction mixture is heated at a temperature and time sufficient to prevent gelation of the reaction mixture on subsequent addition of the remaining aldehyde. Thus, the temperature is raised to at least about 120° C. such as that of about 120° C. to about 160° C. but preferably from about 120° C. to abut 140° C. for about 0.5 to 2.5 hours. After this heating step and cooling of the reaction mixture to about 110° C. or less such as about 80° C. to 110° C. the remainder of aldehyde is added and the reaction mixture heated at a temperature of above about 120° C., such as from about 120° C. to about 160° until the reaction of phenol in the reaction mixture is substantially complete.

In both the low temperature acid catalyst method and the high temperature acid catalyst method, after the reaction mixture is substantially free of the initial aldehyde charge, the reaction mixture is heated to a temperature and time sufficient to prevent gelation of the reaction mixture such as on the subsequent addition of the remaining aldehyde in the high temperature acid catalyst method. The time and temperature for this can vary. Thus, in the case of the low temperature acid catalyst method, gelation has been prevented by heating in the presence of added acid at a temperature of about 100° C. to 140° C. for about one to four hours. In the case of the high temperature acid catalyst method, gelation has been prevented by heating to a temperature of about 120° C. to 160° C. for about 0.5 to 2.5 hours.

Since phenol is charged in excess to the reaction mixture, a substantial quantity of phenol is distilled out of the reactor. The T-P-A condensate of this invention will incorporate therein about 52% by weight of phenolic residue when the aldehyde to triazine molar ratio is about 2.2 and about 67% by weight of phenolic residue when the aldehyde to triazine molar ratio is about 3.5. The point at which the phenol is substantially completely reacted is arrived when the quantity of free phenol in the reactor remains substantially the same, i.e., additional phenol is not being incorporated into the T-P-A condensate.

A low melt viscosity condensate can be prepared when benzoguanamine and/or acetoguanamine are co-reacted with the melamine. The melt viscosity of such condensate can be well below 2,000 cps and even substantially less than 1000 cps or 600 cps at 175° C.

After the substantial complete reaction of the phenol with the intermediate condensate and formation of the T-P-A condensate of this invention, any water which has not distilled out and unreacted phenol are removed from the reaction mixture so that the product is substantially free of water, e.g. less than about 1% and preferably less than about 1.5% by weight, and contains less than about 2% by weight of phenol.

Without wishing to be held to any theory of operation, at the lower temperatures e.g. temperatures of less than 100° C., it appears that the principal reaction is methylolation of the triazine with the aldehyde. In such low temperature methylolation the phenol acts principally as a diluent in the reaction mixture and as a solvent for the intermediate methylolated triazine. At the higher temperatures, e.g., above about 100 or 110° C. the methylolated triazine and/or melamine to melamine condensate reacts with the phenol and phenolation takes place. Again not wishing to he held to any theory of operation, the heating step, in those methods wherein it is performed after the initial methylolation, appears to cause rearrangement of the intermediate melamine to melamine condensate, so as to free up methylene groups to react with the phenol as well as inhibiting gelation of an intermediate condensate. It is also believed that the addition of acid in the low basicity amine catalyst method after the reaction mixture is substantially free of aldehyde causes rearrangement of an intermediate condensate so as to avoid gelation or excessively high viscosity of the T-P-A condensate on the subsequent heating of the reaction mixture for the reaction of the phenol or completion of phenol reaction in the reaction medium.

The P-T-A condensate of this invention can be further reacted with additional formaldehyde, e.g., 5 to 15%, based on the weight of the initial amount of formaldehyde in order to raise the glass transition temperature of cured compositions of the T-P-A condensate and an epoxy resin.

Removal of Water and Free Phenol

Water can be removed from the reaction mixture by distillation. Whatever water is not removed during such distillations, can be removed after completion of the reactions at temperatures of about 150° C. to 160° C. and whatever water remains is removed when the excess phenol i.e., free or unreacted phenol, is removed from the reaction mixture by conventional techniques such as that used for removal of phenol from other novolac resins such as by raising the temperature from about 160° C. to about 190° C. together with increasing the vacuum to about 29 inches of mercury. Steam sparging with or without vacuum at such temperatures can also be used to remove phenol in the product, particularly to achieve free-phenol levels of not more than 2% and particularly levels of less than 0.5%.

The Triazine-Phenol-Aldehyde Condensate

The condensate of this invention will: contain from about 15% to 24% of nitrogen, preferably about 17% to 23% of nitrogen based on the weight of the condensate; have a melt viscosity of not more than about 2,000 cps at 175° C. and preferably not more than 1,000 cps at 175° C.; and have a solubility of at least 80% by weight and preferably 85% by weight of the condensate as measured by the 90:10 methanol:water method at 25° C. or a soluble/insoluble ratio of at least 2.8 as measured by the 90:10 methanol: water method at 25° C., after substantially all of the free water has been removed, e.g., less than about 1% and preferably less than 0.5% of water remains, and the free phenol content is not more than about 2%. Such condensate contains from about 55% to about 65% by weight of phenolic residue incorporated in the condensate when the triazine is melamine, the phenol is phenol itself and the aldehyde is formaldehyde. For a given A/T (aldehyde/triazine) molar ratio, the amount of phenolic residue incorporated in the condensate, relative to when the triazine is melamine and the phenol is phenol itself will decrease when the triazine is acetoguanamine or benzoguanamine, and will also decrease when the aldehyde is other than formaldehyde but will increase when the phenol includes a meta-substituted phenol. Increasing the A/T molar ratio will increase the phenolic residue whereas decreasing this ratio will decrease the phenolic residue. Thus, the phenolic residue incorporated in the condensate of this invention will typically vary from about 52% to about 67% by weight of the condensate.

After removal of the unreacted (free) phenol from the reaction mixture, the free phenol content of the T-P-A condensate of this invention should be less than about 2% and particularly less than about 0.5% by weight of the condensate.

When benzoguanamine and/or acetoguanamine are co-condensed with the melamine in the preparation of the T-P-A condensate of this invention, the melt viscosity of the condensate is significantly reduced.

The T-P-A condensate of this invention has good solubility in organic solvents. Thus the condensate of this invention has a solubility in methanol and MEK (methyl ethyl ketone) of up to 50% solids and in some cases with MEK (Ex 4 and 6 of Table 1) and 1-methoxy-2-propanol solutions having 70% solids can be prepared. The T-P-A condensate of this invention is thermoplastic.

Mixture of T-P-A Condensate and Benzoguanamine and/or Acetoguanamine

The mere physical admixture of small quantities of benzoguanamine or acetoguanamine, e.g., about 0.5 to 20% by weight based on the weight of the T-P-A condensate, and preferably about 5 to about 15% together with the T-P-A condensate, significantly lowers the melt viscosity of the mixture. This is particularly surprising since mixing melamine with the T-P-A condensate causes an increase in the melt viscosity of the mixture. Another advantage of the physical blend is that the nitrogen content is increased relative to the T-P-A condensate. This same phenomenon is attained when benzoguanamine and/or acetoguanamine are physically admixed with other T-P-A condensates, e.g., those of U.S. Pat. No. 5,955,184 of September 1999; U.S. Pat. No. 5,939,515 of August 1999; U.S. Pat. No. 5,322,915 of June 1994; U.S. Pat. No. 4,611,020 of September 1986; as well as European patent 877,040 of Nov. 11, 1998 which is assigned to Dainippon Ink and Chemicals, all of which patents are incorporated herein in their entirety by reference. Benzoguanamine and acetoguanamine can also be mixed with T-P-A condensates for curing of epoxy resin compositions.

Epoxy Compositions Derived From T-P-A Condensates

The T-P-A condensates are useful as curing agents for epoxy resins and as intermediates in epoxy compositions. Glycidylated T-P-A condensate can be made by known methods, i.e., by reaction of the T-P-A condensate with excess epichlorohydrin in the presence of an alkali. Isolation is preferably performed below 100° C. as there may be a tendency to self-crosslink.

The Epoxy Compositions

The epoxy resins used in making the flame retardant compositions and laminates of this invention will typically have WPE values of about 190 to about 10,000 and preferably about 190 to about 500. Illustrative of the epoxy resins, there can be mentioned those of diglycidyl ether resins, such as those having the above mentioned WPE values, prepared by contacting a dihydroxy compound with an excess of epichlorohydrin in the presence of an alkali metal hydroxide wherein the dihydroxy compound can be: bisphenol A; brominated bisphenol A; bisphenol F; resorcinol; neopentyl glycol; cyclohexanedimethanol, and the like; and mixtures thereof. Such resins are also referred to as being based on or derived from the dihydroxy compound involved, e.g. bisphenol A. Also, such conventional epoxy resin can be that of: epoxy phenol novolacs; epoxy cresol novolacs, particularly glycidyl ethers of an o-cresol/formaldehyde novolacs; aromatic glycidyl amine resins such as triglycidyl-p-amino phenol; N,N,N',N'-tetraglycidyl-4,4'-diaminodiphenyl methane; glycidyl ethers of a phenolic novolac; poly (glycidylated) copolymers of glycidyl methacrylate wherein the comonomer includes unsaturated compounds such as acrylates, methacrylates and styrene; and mixtures of the various conventional epoxy resins. Non-glycidylated epoxy resins may also be employed. Examples of such non-glycidylated epoxy resins include: limonene dioxide (weight per epoxy of 85); vinyl cyclohexene dioxide; divinyl benzene dioxide; 5-vinyl-2-norbornene dioxide (weight per epoxy of 76); 1,5-heptadiene dioxide; 1,7-octadiene dioxide. The non-glycidylated epoxy compounds are preferably used in conjunction with glycidylated epoxy resins and are also useful as diluents.

Epoxy curing accelerators are used in the epoxy compositions in a quantity sufficient to accelerate the cure of the epoxy resin. Generally, such quantity is from about 0.05 to 0.5 parts based on 100 parts of the base epoxy resin and particularly about 0.1 to 0.2 parts. Such accelerators include 2-methylimidazole, 2-ethyl-4-methylimidazole, amines such as 2,4,6-tris(dimethylaminomethyl)phenol and benzyldimethylamine, and organophosphorus compounds such as tributylphosphine and triphenylphosphine.

Compositions of this invention when used in electronic applications such as laminates for the production of printed circuit boards will typically comprise the following composition based on 100 parts of an epoxy resin:

(a) about 0–30 parts of phenolic-formaldehyde novolac;

(b) about 30–60 parts of the T-P-A condensate of this invention; and (c) optionally, an epoxy curing accelerator.

The T-P-A condensate of this invention can be used alone as both the curing agent and to impart flame-retardant properties to the epoxy resin. Alternatively, the T-P-A condensate can be used together with one or more conventional epoxy resin curing agents and/or flame-retardant agents.

A variety of curing agents well known in the art can be used together with the T-P-A condensate of this invention in curing the epoxy resin. They include but are not limited to aromatic amines, polyamidoamines; polyamides; dicyandiamide; phenolic-formaldehyde novolacs; melamine-formaldehyde resins; melamine-phenolic-formaldehyde resins; and benzoguanamine-phenolic-formaldehyde resins.

Reactive diluents may also be present in the epoxy compositions to lower viscosity and improve handling characteristics. Examples of reactive diluents include neopentylglycol diglycidyl ether; butanediol diglycidyl ether; resorcinol diglycidyl ether; and cyclohexane dimethanol diglycidyl ether.

When phenolic novolacs are used as curing agents a catalyst (accelerator) is generally employed and may be selected from tertiary organic amines such as 2-alkylimidazoles; benzyldimethylamine; and phosphines such as triphenylphosphine and mixtures thereof.

The phenolic novolac curing agents are condensation products of a phenol with an aldehyde or ketone wherein the phenolic monomer can be selected from phenol itself, cresols, xylenols, resorcinol, bisphenol-A, paraphenyl phenol, naphthol, and mixtures thereof. Substituents for the phenolic monomers include hydroxy, alkyl of 1 to 4 carbon atoms, alkoxy of 1 to 4 carbon atoms as well as phenyl. Particularly preferred curing agents are the phenol-formaldehyde novolacs, e.g., wherein the phenol is phenol itself, and ortho-cresol-formaldehyde novolacs having a molecular weight of about 600 to 5,000 and preferably about 1,000 to 5,000. Illustrative of the aldehydes for preparation of the phenolic novolac curing agents there can be mentioned formaldehyde, acetaldehyde, benzaldehyde and hydroxybenzaldehyde. Illustrative of ketones for preparation of the phenolic novolac curing agents there can be mentioned acetone, hydroxyacetophenone, and methyl ethyl ketone.

A wide variety of solvents may be used in the epoxy compositions of this invention, including halogenated solvents, ketones, alcohols, glycol ethers, glycol acetates, N,N-dimethylformamide. The latter is particularly useful when dicyandiamide is used as curing agent. Ketones include acetone, methyl ethyl ketone, diethyl ketone, and methyl isobutyl ketone.

Laminates of the Epoxy Resin Compositions

The laminates of this invention are conventional laminates containing a reinforcing agent such as glass cloth, and a cured resinous matrix comprising an epoxy resin and a T-P-A condensate of this invention as curing agent and flame-retardant alone or together with other curing agents and/or flame retardant agents for the epoxy resin. The laminates of this invention will comprise the reinforcing agent together with the cured epoxy compositions mentioned hereinabove.

The structure of the laminates of this invention are the same as those of conventional laminates containing a reinforcing agent such as glass cloth, and a resinous matrix comprising an epoxy resin and a curing agent for the epoxy resin.

The laminates of this invention will generally contain about 40% to 80% by weight of resinous matrix material and about 20% to 60% by weight of reinforcing material such as glass cloth.

Conventional laminating techniques can be used in making the laminates of this invention such as the wet or dry-lay-up techniques. Multiple layers of resin impregnated reinforcing material, upon curing, make up the laminate.

The pressure used in making the laminates can vary from the contact pressure of applying a laminated lining to a tank wall to the high pressure, e.g., 1,000 psi or more, used in the manufacture of electrical insulation sheets. The temperature used in making the laminates can vary over a wide range such as that of about room temperature to over 210° C.

The laminate can be prepared at room temperature or by heating under pressure a layer comprising at least one sheet of prepreg comprising an epoxy resin as impregnate. The pressure used in making the laminates can vary from the contact pressure of applying a laminated lining to a tank wall to the high pressure, e.g., 1,000 psi or more, used in the manufacture of electrical insulation sheets. The temperature used in making the laminates can vary over a wide range such as that of about room temperature to over 210° C. The use of a solvent in the laminate compositions is optional. Conventional laminating techniques can be used in making the laminates of this invention, e.g., such as the wet or dry-lay-up techniques.

Reinforcing fibers or fabrics of reinforcing fibers for use in laminates include glass fibers and mats; carbon and graphite fibers, cellulosic paper, fibrous polyamide sheets, fibrous quartz sheets, woven fibrous glass cloth, unwoven fibrous glass mat, and the like. The epoxy resin composition will be impregnated in the reinforcing fibers or fabrics or the interstices formed from of such fibers or fabrics. Fillers such as quartz powdered, mica, talc, calcium carbonate and the like may also be added to the resinous matrix in the manufacture of the laminate.

Phosphorus containing additives for epoxy formulations with the triazine-phenol-aldehyde condensate of this invention include: elemental red phosphorus; phosphorus and phosphoric acids; triphenyl phosphine; triphenyl phosphine oxide; cyclic and linear phosphazines such as various phenoxyphosphazene compounds; tris(2-hydroxyphenyl)-phosphine oxide; 9,10-dihydro-9-oxa-10(2,5-dioxotetrahydro-3-furanylmethyl)-10-phosphphaphenanthrene-10-oxide; melamine phosphate; melamine cyanurate; non-halogenated phosphorus compounds in U.S. Pat. No. 3,702,878; U.S. Pat. No. 5,481,017; U.S. Pat. No. 4,086,206; and bis(2,4-di-t-butylphenyl) pentaerythritol diphosphite (Ultranox 626 by GE Specialty Chemicals of Parkersburg , W.Va.) The quantity of the phosphorus containing additive can vary from about one percent to ten percent based on the weight of the T-P-A additive.

The weight average molecular weight (Mw) and number average molecular weight (Mn) herein are measured using size exclusion gel permeation chromatography (SEC) and phenolic compounds and polystyrene standards. The sample molecular weight to be measured is prepared as follows: the sample is dissolved in tetrahydrofuran and the solution is run through a gel permeation chromatograph. Any free phenolic in the sample is excluded from calculation of molecular weight. SEC as a measure of molecular weight is highly dependant on the hydrodynamic volume of the material in solvent. Highly branched or polycyclic materials tend to give lower values than molecular weights determined by other means such as vapor phase osmometry (VPO).

In order that those skilled in the art may more fully understand the invention presented herein, the following procedures and examples are set forth. Unless otherwise indicated, the following units of measurement and definitions apply in this application: all parts and percentages are by weight; temperatures are in degrees centigrade (0° C.); use of oxalic acid is as the dihydrate; and readings of vacuum are in inches of mercury.

All heating steps in the examples herein were conducted under a nitrogen atmosphere, unless otherwise specified.

Determination of Solubilities in 90:10 (w/w) Methanol-Water (25° C. +/−1° C.)

A 4 ounce jar with stir bar is charged with 10.0 g (gram(s)) condensate and 27 g of methanol. The jar is capped and the mixture is stirred at ambient temperature until the condensate is dissolved or until no further dissolution occurs (typically one-half to about 2 hours). To the stirred mixture is added dropwise 3.0 g of deionized water. The mixture is further stirred at least 1 hour and then allowed to settle unstirred. Twenty (20.0) g of clear liquor is transferred to an aluminum weighing cup. Solvent is largely evaporated and further drying occurs in an oven at 60° C. for about 2 hours. Essentially complete drying is attained followed by heating 2 hours at 100° C. under 29 to 29.25 inches of mercury vacuum. The residue, if any, represents the soluble fraction from the 20 g of solution. Any insoluble fraction left in the jar is obtained by removing all the remaining clear liquor and drying the insolubles as described above. In instances where insolubles are a free flowing powder, centrifugation is employed to separate clear solution from solid. Time to reach equilibrium solubility can be accelerated by warming (e.g., 35° C.) the stirred methanol-condensate mixture and adding the water dropwise. Stirring for another 1 hour and then allowing the temperature to reach ambient. The solubility percentage is determined by dividing the insoluble portion in grams by ten due to the 10 gram sample to get the insoluble percentage and then subtracting the insoluble percentage from 100 to arrive at the solubility percentage of the condensate involved. Thus, from Table 5 the solubility percentage for Durite SD 1732 (a novolac resin of Borden Chemical, Inc of Columbus, Ohio) is 100% since there are no insolubles whereas the solubility of Example 25 is 82%.

Determination of Melt Viscosities

Viscosities, at 175° C., were determined with a cone and plate viscometer from Research Equipment (London) Ltd. Number 40 and 100 spindles were used depending on the viscosity reading. A factor multiplier of 300 was used for the Number 40 spindle and a factor multiplier of 800 was used for the of 100 spindle values shown from digital readout. For example, a digital reading of 20 obtained with a #40 cone spindle would be multiplied by 300 to give a viscosity value of 600 cps.

EXAMPLE 1

Preparation of Melamine-Phenol-Formaldehyde Condensate

| Materials | Grams | Moles |
|---|---|---|
| 1. Phenol | 696.9 | 7.37 |
| 2. Melamine | 100.8 | 0.80 |
| 3. N,N'-dimethyl benzylamine | 2.0 | — |
| 4. 50% HCHO | 143 | 2.4 |

Procedure for Example 1
1. Charge 1, 2 and 3 to flask.
2. Heat to 45° C.
3. Add 4 over 50 minutes.
4. Hold at 45° C. for 3.3 hours.
5. Heat to 70° C. for 1.5 hours and then for half an hour at 115° C.
6. Atmospherically distill to 160° C.
7. Vacuum distill to 190° C. gradually increasing to full vacuum of about 29.25 inches of mercury without the use of steam sparge.
8. Discharge product (288.5 g) and vacuum distillate (461.3 g). Nitrogen atmosphere was used in this example but no steam sparge.

EXAMPLE 2

Preparation of Melamine-Phenol-Formaldehyde Condensate

| Materials | Grams | Moles |
|---|---|---|
| 1. Phenol | 696.9 | 7.37 |
| 2. Melamine | 100.8 | 0.80 |
| 3. N-methyl morpholine | 1.0 | — |
| 4. 50% HCHO | 143 | 2.4 |
| 5. 96% Formic acid | 3% on reaction mixture | |

Procedure
1. Charge 1, 2, and 3 to flask.
2. Heat to 55° C.
3. Add 4 over 50 minutes.
4. Hold at 550° C. for 3.33 hours.
5. Add 5
6. Heat to 100° C. for 2.5 hours and then the reaction mixture is heated to reflux (109.6° C.) and maintained at reflux for 1.75 hours.
7. Atmospherically distill to 188° C. prior to recovery of phenol. Neither steam sparge nor nitrogen atmosphere was used in this example.

COMPARATIVE EXAMPLE 3

Preparation of Melamine-Phenol-Formaldehyde Condensate

This example was performed in the same manner as Example 1 above except to the extent shown in Table 1A. After the formaldehyde reaction was completed at 45° C., the reaction mixture was heated for 2 hours at 70° C. and then one hour at 100° C. A nitrogen atmosphere was used but with no steam sparge.

EXAMPLE 4

Preparation of Melamine-Phenol-Formaldehyde Condensate

This example was performed in the same manner as Example 1 above except to the extent shown in Table 1A. A nitrogen atmosphere or steam sparge was not employed.

EXAMPLE 5

Preparation of Melamine-Phenol-Formaldehyde Condensate

| Materials | Grams | Moles |
|---|---|---|
| 1. Phenol | 696.9 | 7.37 |
| 2. Melamine | 100.8 | 0.80 |
| 3. N,N'-dimethylbenzylamine | 2.0 | — |
| 4. 50% HCHO | 143 | 2.4 |
| 5. 96% formic acid | 28* | |

Procedure:
1. Charge 1, 2 and 3 to flask.
2. Heat to 45° C.
3. Add 4 over 50 minutes.
4. Hold at 45° C. for 4.5 hours.
5. Add 5.
6. Heat to 70° C. and then to 100° C. over 2.5 hours.

7. Atmospherically distill to 175° C.
8. Vacuum distill to 180° C. gradually increasing to full vacuum of about 29.5 inches of a mercury.
9. Discharge product (346 g) and vacuum distillate (416 g). Nitrogen atmosphere was used but without steam sparge.
   * Approximately 36 g reaction mixture had been previously removed for formaldehyde testing and for testing with/without formic acid. Treating this solution with only 1% formic acid, based on the weight of the reaction mixture, led to gelation upon heating 20 minutes at about 77° C.

EXAMPLE 6 AND EXAMPLE 7

Preparation of Melamine-Phenol-Formaldehyde Condensate

These examples were performed the same way as Example 3 above except to the extent shown in Table 1A and without the steam sparge.

EXAMPLE 8

Preparation of Melamine-Phenol-Formaldehyde Condensate

This example was performed the same manner as Example 7 above but at 3 times the scale of all ingredients used in Example 7.

EXAMPLE 9

Preparation of Melamine-Benzoguanamine-Phenol-Formaldehyde Condensate

This example was performed the same way as Example 3, except to the extent shown in Table 2A but without steam sparge.

EXAMPLE 10

Preparation of Melamine-Benzoguanamine-Phenol-Formaldehyde Condensate

| Materials | Grams | Moles |
| --- | --- | --- |
| 1. Phenol | 696.9 | 7.37 |
| 2. Benzoguanamine | 15.0 | 0.08 |
| 3. Melamine | 90.7 | 0.72 |
| 4. Triethylamine | 2.0 | |
| 5. 50% HCHO | 138 | 2.30 |

Procedure for Example 10:
1. Add 1, 2, 3 and 4 to flask.
2. Heat to 45° C.
3. Add 5 over 50 minutes.
4. Hold at 45° C. for 4.5 hours.
5. Heat at 70° C. for 2 hours.
6. Atmospherically distill to 175° C. over the course of 2 hours.
7. Vacuum distill to 195° C. gradually increasing to full vacuum of about 29.5 inches of mercury.
8. Discharge product (372 g) and vacuum distillate (394 g).

EXAMPLE 11

Preparation of Melamine-Benzoguanamine-Phenol-Formaldehyde Condensate

This example was performed the same way as Example 3, except to the extent shown in Table 2A and without the use of nitrogen atmosphere and without steam sparge.

EXAMPLE 12

Preparation of Melamine-Benzoguanamine-Phenol-Formaldehyde Condensate

This example was performed the same way as Example 3, except to the extent shown in Table 2A but without steam sparge and without the use of nitrogen atmosphere.

EXAMPLE 13

Preparation of Melamine-Benzoguanamine-Phenol-Formaldehyde Condensate

This example was performed the same way as Example 1, except to the extent that (a) the formaldehyde was reacted at 55° C. instead of 45° C. followed by heating the reaction mixture for 3 hours at 70° C. and then heating the reaction mixture to 170° while atmospherically distilling; and (b) shown in Table 2A.

EXAMPLE 14

Preparation of Melamine-Benzoguanamine-Phenol-Formaldehyde Condensate

This example was performed the same way as Example 3, except to the extent as shown in Table 2A. Both nitrogen atmosphere and steam sparge were used.

EXAMPLE 15

Preparation of Melamine-Benzoguanamine-Phenol-Formaldehyde Condensate with High Benzoguanamine Content A one liter flask was charged with 564.6 g of phenol (6.0 moles), 50.4 g melamine (0.4 moles), 50.4 g of benzoguanamine (0.269 mole) and 1.64 g of triethylamine. The reaction mixture was heated to 45° C. whereupon 87 g of 50% formalin (1.45 moles) were added over one hour. No formaldehyde was detected one hour later at 45° C. The reaction mixture was then heated two hours at 70° C. and one hour at 100° C. followed by atmospheric distillation to 160° C. Product (266 g) and phenol (404 g) were recovered as in Example 21, part C. The product is characterized in Example 15 of table 2A. A nitrogen atmosphere was used but the product was not steam sparged.

In a similar manner to Example 15, benzoguanamine can be substituted with acetoguanamine.

EXAMPLE 16, EXAMPLE 17, EXAMPLE 17A (which contained ⅓ less phenol) and Example 18

Preparation of Melamine-Phenol-Formaldehyde Condensate

These examples were performed in the same manner as Example 3 above except to the extent shown in Table 1A. The products were steam sparged. The higher viscosity of Example 18, in comparison with Example 17, appears to be due to residual quantities of the DIPE catalyst remaining in the product. DIPE has a much higher boiling point (187° C.–192° C.) than the TEA of Example 17 which has a boiling point of 89° C. Also, DIPE is a weaker amine than TEA.

EXAMPLE 18A

Effect of Formic Acid on Example 18

150 g of product from Example 18 was dissolved at 100° C. in 250 g phenol and 40 g water. 4.4 g of 90% formic acid was added. pH of this solution was 5.56 (2.1 g dissolved in 21 mls (milliliters) of methanol). The solution was heated under nitrogen for one hour at 110° C., 2 hours at 120° C. and then heated to 170 ° C. over 0.5 hour, and held at 170 for one hour. Product (45 g) and phenol (223 g) was removed as in Ex 21C. Product is characterized as follows: phenol of 0.03%; Mw/Mn of 720/310; viscosity (175° C.) of 2430 cps (1030 cps for Ex 18). The data shows that the post treatment with formic acid increased both viscosity and molecular weight.

In the tables presented herein, abbreviations in the tables and references thereto have the following meanings: "Ex" is Example; "Cat." or "Catalyst" is the catalyst if any used in the example; "Add Temp., ° C." is the temperature of the reaction mixture at the time formaldehyde or another aldehyde is added; "Post Formic Acid" indicates whether or not formic acid was used after the initial reaction with of the formaldehyde; "Phenol %" is the amount of unreacted phenol in the product; "F/M" is the molar ratio of formaldehyde to melamine; "N, %" is percent of nitrogen; "Mw/Mn" is weight molecular weight over number molecular weight; "Visc., cps (175° C.)" is viscosity in centipoise at 175° C.; and "MEK" is methyl ethyl ketone.

(2) Post addition of formic acid and heating reduces viscosity and molecular weight relative to no added formic acid for a given catalyst, e.g., see Ex 5 vs. Ex 6.
(3) Use of acetic acid in place of formic acid in post-aldehyde heating increases viscosity but with little effect on molecular weight, e.g., see Ex's 2 and 3.
(4) Increasing basicity of amine catalyst leads to a decrease in viscosity for a given F/M mole ratio and aldehyde addition temperature, e.g., see Ex's 17 and 18. Order of basicity is with TEA greater than DIPE which is greater than DMBA.
(5) Physical incorporation of 5–10% of benzoguanamine in a melamine-phenol-formaldehyde condensate significantly reduces the viscosity, e.g., see Ex's 2 and 7.
(6) Use of formic acid catalyst with post addition of formic acid can afford properties (%N, Mol. Wgt., viscosity) typical of that obtained using increasingly strong amine catalyst.
(7) Use of acetic acid which has a pK acidity of 4.8 instead of 0.5–3.8, as with the other acids used in the examples, produced a condensate having unacceptably high viscosity.

TABLE 1A

Melamine-Phenol-Formaldehyde Condensates

| Ex | Catalyst, %[a] | F/M* | Add Temp., ° C. | Post Formic Acid[b] |
|---|---|---|---|---|
| 1 | DMBA (0.29) | 2.5 | 45 | No |
| 2 | NMM (1) | 3.0 | 55 | Yes |
| 3 | NMM (1) | 3.0 | 55 | Acetic Acid |
| 4 | DMEA (0.29) | 3.0 | 45 | No |
| 5 | DMBA (0.29) | 3.0 | 45 | Yes |
| 6 | DMBA (0.29) | 3.0 | 45 | No |
| 7 | FA (0.1) | 3.0 | 55 | Yes[l] |
| 8[g] | FA (0.1) | 3.0 | 45 | Yes[l] |
| 16 | TEA (0.29) | 3.2 | 45 | No |
| 17 | TEA (0.29) | 2.5 | 45 | No |
| 17A[j] | TEA (0.29) | 2.5 | 45 | No |
| 18 | DIPE (0.29) | 2.5 | 45 | No |
| 20 | DIPA (0.29) | 2.5 | 45 | No |

TABLE 1B

Properties of Melamine-Phenol-Formaldehyde Condensates

| Ex | Phenol, % | N, % | Mw/Mn | Visc., cps (175° C.) |
|---|---|---|---|---|
| 1 | 0.56 | 22.4 | 558/343 | 2396 |
| 2 | 0.35, (0.13[d]) | 16.55 | 422/266; (518/282)[d] | 416 (177° C.) (264)[e] |
| 3 | 1.01 | 18.11 | 413/322 | 1030 |
| 4 | 0.59 | 19.4 | 469/342 | 2485 |
| 5 | 0.61 | 18.15 | 319/269 | 461 |
| 6 | 0.6 | | 499/341 | 2804 |
| 7 | 0.06 | 18.3 | 558/352 | 1527; (958)[f] |
| 8[g] | 0.08 | 16.08 | 414/272 | 213 |
| 16 | 0.15 | 17.4 | 618/332 | 977 |
| 17 | 0.20 | 20.8 | 453/289[k] or 453/289 (1935)[k] | 639 |
| 17A[j] | 0.53 | 23.1 | 331/253 | >8100 |
| 18 | 0.08 | 20.6 | 468/284 | 1030 |
| 20 | 0.04 | 20.5 | 363/265 | 180 |

From the results in Table 1A and 1B it can be seen that:
(1) Decreasing the F/M ratio increases the % nitrogen, e.g. see Ex 1 vs. Ex 5. as well as the differences in Ex 17 from Ex 16, for a given catalyst.

TABLE 2A

Melamine-Benzoguanamine-Phenol-Formaldehyde Condensates

| Ex* | Catalyst, %[a] | F/M | Add Temp., ° C. | Post Formic Acid[b] |
|---|---|---|---|---|
| 9 | TEA (0.144) | 3.0 | 47 | No |
| 10 | TEA (0.29) | 3.0 | 45 | No |
| 11 | TEA (0.43) | 3.0 | 45 | No |
| 12 | NMM (1) | 3.0 | 55 | Yes |
| 13 | NMM (1) | 3.0 | 55 | Yes |
| 14[h] | TEA (0.29) | 3.0 | 45 | No |
| 15[i] | TEA (0.29) | 2.5[i] | 45 | No |

TABLE 2B

Properties of Melamine-Benzoguanamine-Phenol-Formaldehyde Condensates

| Ex | Phenol, % | N % | Mw/Mn | Visc., cps (175° C.) |
|---|---|---|---|---|
| 9 | 2.34 | 18.77 | 277/237 | 213 |
| 10 | 1.13 | 17.08 | 329/260 | 213 |
| 11 | 0.78 | 16.69 | 350/267 | 213 (1798 at 150° C.) |
| 12 | 0.22 | 17.0 | 365/288 | 533 |
| 13 | 0.16 | 16.57 | 349/283 (368/285)(d) | 355 |
| 14[h] | 0.14 | 17.1 | 440/284 | 320 |
| 15[i] | 0.01 | 19.8 | 341/249 | 270 |

In the above Tables 1A, 1B, 2A and 2B, the following superscripts have the following meanings.

* Melamine/Benzoguanamine mole ratio=9, unless indicated otherwise.

[a] % on phenol. NMM=N-methyl morpholine; DMEA=N,N-dimethylethanolamine; DMBA=N,N-dimethyl benzylamine; FA=formic acid; TEA=triethylamine and DIPE=2-(diisopropylamino) ethanol.

[b] 3% on reaction solution after attaining high formaldehyde conversion.

[d] Post dried (180–185° C.), full vacuum.

[e] Physically blended with 10% benzoguanamine.

[f] Physically blended with 5% benzoguanamine.

[g] 3×scale of Ex 6 and heating 4 hours at 170–175° C. to decompose formic acid prior to vacuum distillation of phenol.

(h) Melamine/benzoguanamine mole ratio=18.

(i) Melamine/benzoguanamine mole ratio=1.49 (i.e., equal weights) formaldehyde/(melamine+benzoguanamine)= 2.5 and phenol/melamine+benzoguanamine mole ratio=8.97

(j) The quantity of phenol used in this Ex 17A was 1/3 less than that of Ex 17.

(k) A molecular weight value of 1935 was obtained via vapor phase osmometry in MEK.

(l) Added at 55° C. followed by heating 2 hours at 70° C. and 1 hour at 100° C. prior to recovery of water and phenol.

It can be seen from the results in Table 2A and 2B that by condensing benzoguanamine together with melamine, phenol and formaldehyde the following results are obtained:
(1) Relatively low Viscosities (i.e., 213–533 cps at 175° C.) are obtained regardless of which catalyst is used and regardless of the melamine/benzoguanamine mole ratio. Thus, see Ex's 10, 14 and 15.
(2) Viscosities are lower than those obtained in the absence of the benzoguanamine reactant.
(3) Increasing the quantity of TEA catalyst, e.g., Ex's 9 through 11, decreases the % nitrogen, while modestly increasing molecular weight but with little effect on viscosity.

EXAMPLE 19

Melamine-Phenol-Benzaldehyde-Formaldehyde Condensate

| Materials | grams (g) | Moles |
|---|---|---|
| 1. Phenol | 696.9 | 7.38 |
| 2. Triethylamine | 2.0 | — |
| 3. Melamine | 50.4 | 0.40 |
| 4. Benzaldehyde | 21.2 | 0.20 |
| 5. Melamine | 50.4 | 0.40 |
| 6. 50% formalin | 132.0 | 2.20 |

Procedure
1. Charge 1, 2, and 3 to flask
2. Heat to 60° C.
3. Add 4
4. Heat 1 hour at 60° C.
5. Over 1.33 hours heat from to 70° C. to 100° C.
6. Heat 1 hour at 100° C., 2 and 2/3 hours at 120° C., 3.5 hours at 130° C. to react 91% of benzaldehyde.
7. Cool to 45° C.
8. Add 5.
9. Add 6 over 1 hour
10. Hold at 45° C. for 2 hours.
11. Heat to 70° C., hold for 2 hours.
12. Heat one hour at 10° C.
13. Atmospherically distill to 160° C. to collect 70 mls distillate.
14. Vacuum distill to 190° C. gradually increasing vacuum to 30 inches of mercury.
15. Break vacuum and introduce 95 ml (milliliters) deionized water over 55 minutes.
16. Heat at 190° C. under 30 inches of vacuum.
17. Discharge product (384.8 g) and vacuum distillate (404 g). Analysis of the product showed 0.25% of phenol; 16.95% of nitrogen; Mw/Mn of 499/319; and visc. (viscosity) at 175° C. of 840 cps.

In a similar manner to Example 19, benzaldehyde may be substituted with an equal or twice the molar amount of acetaldehyde, isobutyraldehyde or crotonaldehyde except that reaction of these aldehydes is conducted below 100° C.

EXAMPLE 20

Preparation of Melamine-Phenol-Formaldehyde Condensate

This example was performed in the same way as example 3 except to the extent as shown in Table 3A. Both nitrogen atmosphere and steam sparge were used.

EXAMPLE 21

This example repeats Example (Ex) 17 of Tables 1A and 1B but at 3.3 time the scale insofar as ingredients are concerned. Thus, a 3 liter flask was charged with 2,296 g of phenol (24.41 moles), 332.6 g of melamine (2.64 moles) and 6.6 g of triethylamine and then heated under nitrogen. 396 g of 50% formalin (6.59 moles) was then added over one hour at 45° C. followed by 2.33 hours at 45° C. The mixture was then divided into 3 parts as follows:

Part A. 458.5 g charged to a 500 ml flask;

Part B. 920 g charged to a one liter flask;

Part C. remainder (1,637 g) transferred to a 2 liter flask.

Part C is performed as follows:
1. Heat 2 hours at 70° C. and then 1 hour at 100° C.
2. Atmospherically distill to 160° C.
3. Vacuum distill to 190° C. gradually increasing vacuum to 29.25 inches.
4. Break vacuum and introduce 175 ml deionized water at 190° C. over one hour.
5. Vacuum dry at about 190° C. under 29.25 inches of vacuum.
6. Discharge product (579 g) and vacuum distillate (815 g), exclusive of about 17 g phenol layer from simulated steam sparge. (The steam sparge in this and other examples where used, was conducted by adding water to the hot reaction mixture so as to form steam).

PART A. of Example 21. After formaldehyde reaction at 45° C., heat to 110° C. and 28 hold 4 hours at 110° C. (versus step 1 of PART C.). Then continue with steps 2–6 of Part C as set forth above but with less water for steam sparge. Product yield was 168 g and then recovered phenol from vacuum distillation (251 g).

Procedure for PART B of Example 21 (Ex 21B). 920 g was heated 4 hours at 110° C. and then cooled to 60° C. whereupon 24 g of a solution of 25% formaldehyde in water was added over 15 minutes. Then 12 g of 50% formalin was added at 60° C. This raised the F/M mole ratio to 3.0. After one hour at 60° C. all the formaldehyde had reacted. The reaction mixture was then heated 2 hours at 110° C., followed by atmospheric distillation to 160° C., and vacuum distillation to 1900 together with steam sparge to recover phenol.

| | Phenol % | N % | Mw/Mn | Visc. (175° C.), cps |
|---|---|---|---|---|
| Part A | 0.13 | 19.48 | 344/256 | 234 |
| Part B | 0.27 | 17.26 | 482/301 | 294 |
| Part C | 0.34 | 20.22 | 328/258 | 450 |

TABLE 3A

Melamine-Phenol-Formaldehyde Condensates

| Ex | Catalyst[a] | F/M | CH$_2$O Add | Temperature, °C./Hours Post Add |
|---|---|---|---|---|
| 19[b] | TEA | 2.75 | 45/1 | 45/2; 70/2; 100/1; 120/0.5 |
| 20 | DIPA | 2.5 | 45/1 | 45/1.67; 70/2; 100/1 |
| 21C | TEA | 2.5 | 45/1 | 70/2; 100/1 |
| 21A[e] | TEA | 2.5 | 45/1 | 110/4 |
| 21B[e] | TEA | 2.5 (3.0)[c] | 45/1 | 110/4[c] |
| Ex 22 | TEA | 2.5 | 100/1 | 100/5.2 |
| Ex 23 | TEA | 2.5 | 115/0.5[d] 115/0.5 | 115/4 |
| Ex 24 | TEA | 2.2 | 115/0.5[d] 115/0.5 | 115/4 |
| Ex 25 | TEA | 2.5 | 45/1 | 70/2, 100/1 |
| Ex 26 | 0.5% OX.H$_2$O | 2.2 | 115/0.5[f] 115/0.5 | 123/2 |
| Ex 27 | 0.5% OX.H$_2$O | 3.0 | 115/0.5[f] 155/0.5 | 123/2 |
| Ex 28 | 0.2% OX.H$_2$O | 3.0 | 125/0.5[h] 125/0.5 | 125/2 |
| Ex 29 | 0.2% OX.H$_2$O | 3.0 | 80/0.5[i] 80/0.5 | 123/1, 140/2, 160/1 |
| Ex 30 | 1% Formic Acid | 2.5 | 100/0.33[j] 100/0.33 | 100/0.5 |

TABLE 3B

Properties of Melamine-Phenol-Formaldehyde Condensates

| Ex | Phenol, % | N, % | Mw/Mn | Visc., cps (175° C.) |
|---|---|---|---|---|
| 19 | 0.25 | 16.95 | 499/319 | 840 |
| 20 | 0.04 | 20.5 | 363/265 | 180 |
| 21C | 0.34 | 20.22 | 328/258 | 450 |
| 21A | 0.13 | 19.49 | 344/256 | 234 |
| 21B | 0.27 | 17.26 | 482/301 | 294 |
| 22 | 0.21 | 19.4 | 400/275 | 225 |
| 23 | 0.09 | 19.62 | 361/258 | 300 |
| 24 | 0.13 | 21.7 | 361/263 | 180 |
| 25 | Not Detected | 19.56 | 433/295 | 396 |
| 26 | 0.23 | 23.22 | 415/306[g] 399/307 | 1470 (2280)[g] |
| 27 | 0.73 | 18.83 | 699/398 | 5103 |
| 28 | 0.32 | 19.26 | 793/429 | >8100 |
| 29 | 0.43 | 18.65 | 475/324 | 1098 |
| 30 | 0.21 | 21.49 | 434/304 | 1350 |

Reference letters in the above Tables 3A and 3B are as follows:

[a] 0.29% on phenol. DIPA=diisopropylamine; TEA=triethylamine; "OX.H2O is oxalic acid dihydrate.

[b] 0.2 moles benzaldehyde per 0.8 mole of melamine.

[c] Post added CH$_2$O at 60° C. for 25 minutes, further reacted as follows (60° C. for 1 hour; and 110° C. for 2 hours)

[d] Distilled before second CH$_2$O feed

[e] F/(M+B)=2.5. Equal weights of benzoguanamine (B) and melamine (M) were used.

[f] Half CH$_2$O feed over 30 minutes, then reacted for 2.5 hours at 123° C. before second feed over 30 minutes.

[g] post vacuum dried in the oven @ 185° C. and 20.5 inches of mercury vacuum for 1.5 hours.

[h] half CH$_2$O feed over 30 minutes, then reacted for 1 hour at 125° C. before second feed over 30 minutes.

[i] half CH$_2$O feed over 30 minutes, then reacted for 1 hour at 123° C. before second feed over 30 minutes.

[j] Half CH$_2$O feed over 20 minutes, then reacted for 2 hours at 123° C. before second feed over 20 minutes.

From the results in Tables 3A and 3B, it can be seen that:

(1) Adding formaldehyde at high temperature, e.g., 100° C. or 115° C. in Ex's 22 and 23 vs. low temperatures, e.g., 45° C. in Ex 21C, leads to a modest increase in molecular weight but a reduction in viscosity of a given catalyst and F/M mole ratio.

(2) Post reaction with formaldehyde increases both molecular weight and viscosity. Thus, see Ex's 21B vs. 21A.

(3) Adding formaldehyde for a given F/M (3.0) at ≧115° C. with oxalic acid catalyst leads to very high viscosity and increased molecular weight whereas addition at lower temperature (80° C., Ex 29) leads to lower viscosity and molecular weight.

(4) Addition of formaldehyde at 100° C. with formic acid catalyst (1%, Ex 30) gives product meeting the requirements of this invention and utilizes significantly less acid than the low temperature acid process (Ex's 7 and 8).

EXAMPLE 23

Preparation of Melamine-Phenol-Formaldehyde Condensate With Addition of Aldehyde at 115° C. (F/M=2.5)

A one liter flask was charged with 696 g of phenol (7.4 moles), 100.8 g of melamine (0.8 mole) and 2.0 g of triethylamine. The reaction mixture was heated to. 115° C. and then 60 g of 50% formalin (1.0) mole was added over 28 minutes. Then, 29.6 g distillate was removed at 10–109° C. while increasing vacuum to 22 inches of mercury over 20 minutes. The temperature was raised to 115° C. whereupon an additional 60 g of 50% formalin (total 120 g which is 2 moles) was added over 31 minutes. A sample taken one minute later indicated 50.5% of the phenol had reacted, relative to moles of aldehyde added. A temperature of 114–115° C. was maintained for 4 hours at which time about 95% of phenol had reacted, relative to added aldehyde. Reaction mixture was then atmospherically distilled to 160° C. to collect 64.7 g distillate. Phenol (434.3 g) was then recovered by vacuum distillation increasing temperature to 190° C. while increasing vacuum to 30 inches of mercury. When phenol appeared to stop distilling over, vacuum was broken and 118 ml of deionized water added over 30 minutes at 185–190° C. Vacuum was then applied to remove water at 190° C., under 30 inches of mercury vacuum. Product yield was 336.1 g and is characterized in Table 3B.

EXAMPLE 24

Preparation of Melamine-Phenol-Formaldehyde Condensate

This example was conducted in the same manner as Example 23 above except that the F/M ratio was 2.2.

EXAMPLE 25

Preparation of Melamine-Phenol-Formaldehyde Condensate and Post Reaction With Oxalic Acid A one liter flask was charged with 696 g phenol (1.4 moles), 100.8 g melamine (0.8 mole) and 2.0 g triethylamine. The flask contents were heated to 45° C. and then 120 g of 50% formalin (2.0 moles) was added at 45° C. over one hour. No formaldehyde was detected after one and a half hours later at 45° C. The reaction mixture was then heated to 70° C. and held at 70° C. for 2 hours, then heated to 100° C. and held for one hour at 100° C. The reaction was then heated to 140° C. during which time 79 mls of distillate was collected. The reaction was then cooled to 90° C. and 10.4 g of oxalic acid dihydrate with 20 g of water were added. The reaction was then heated 2 hours at 110° C. and then raised to 140° C. and held at 140° C. for one hour. Product (320.1 g) and phenol (443.5 9) were recovered as in Example 21, Part C.

EXAMPLE 25A

Epoxidation of Example 25

A 3 liter flask was charged with 150 g melamine-phenol-formaldehyde condensate, 400 g isopropyl alcohol, and 777 g epichlorohydrin and stirred well to dissolve the condensate. Then 186.7 g water was added and the reaction mixture heated to 55° C. Over the course of 15 minutes, 60 g of 20% sodium hydroxide was added while maintaining a temperature of 55° C. After 30 minutes, 180 g of 20% sodium hydroxide was added over the course of one hour. Heating at 55° was continued for another 30 minutes whereupon 334 g ice water and 67 g dry ice were added. After mixing well, the contents of the flask were transferred to a separatory funnel. The aqueous layer was drawn off and discarded. The organic layer was washed with ice water and dry ice as before. The washed organic layer was transferred to a 3 liter flask for atmospheric distillation. Heating to 105° C., 627 mls of distillate was removed. Then 23.7 g of clean mobile solution was removed to be treated as described later. Distillation was continued under vacuum starting at 90° C. Over the course of 65 minutes the temperature and vacuum were increased to 119° C. and 21 inches of mercury, respectively, at which time the reaction was quite viscous. Vacuum was broken and taffy-like product discharged. 160.7 g vacuum distillate was recovered.

20.2 g of earlier removed clear solution of this Example 25A (heated to 105° C.) was dissolved in an equal weight of chloroform and 40 g hexanes gradually added while stirring. The mixture was stirred one hour and then liquor decanted off and discarded. The residue was largely dissolved in 20 g of chloroform and re-precipitated with 40 g hexanes. The precipitate was vacuum dried for 5 hours at 29 inches of vacuum mercury at room temperature. Yield of whitish friable solid was 9.4 g which was soluble in Dowanol PM (1-methoxy-2-propanol), a product of Dow Chemical of Midland, Mich. but not in tetrahydrofuran or methyl ethyl ketone. The weight per epoxy equivalent (WPE) was 512. A WPE value of about 300 may be obtained by removing the bulk of isopropyl alcohol and epichlorohydrin under vacuum at about 70–75° C. and treating the condensate with chloroform/hexanes as described above. The WPE was determined by the Pyridinium Chloride in Pyridine method described in "Epoxy Resins-Chemistry and Technology", C. A. May (Marcel Dekker Publisher, 1988), pp 1059–1060.

EXAMPLE 26

Melamine-Phenol-Formaldehyde Condensate (F/M= 2.2) With Oxalic Acid at 115° C.

A one liter flask was charged with 730.8 g of phenol (7.77 moles), 105.8 g of fi melamine (0.84 moles) and 3.65 g of oxalic acid dihydrate and heated to 115° C. 55.4 g of 50% formalin (0.923 mole) was then added over 28 minutes and the reaction taken to reflux (123° C.) and maintained at reflux for 2.33 hours. The reaction mixture was cooled to 115°° C. whereupon 57.3 g was removed for external screening and then 52 g of 50% formalin added over 30 minutes which reduced the temperature to reflux (about 111.6° C.). The reaction mixture was heated to 123° C. at which time 52.2 g distillate was removed. After additional heating at 123° C. for 2 hours, the reaction was heated to 160° C. to remove an additional 30 g of distillate. Product (280 g) and phenol (499 g) were then recovered by increasing the temperature to 190° C. while increasing vacuum to 30 inches of mercury. The product is characterized in Table 3B.

COMPARATIVE EXAMPLE 26A

An experiment, similar to the above Example 26 was performed on slightly smaller (5%) scale, except that after one-half of the aldehyde was added, 29.1 g distillate was removed under vacuum at 105° C. to 110° C. prior to addition of the remainder of the aldehyde at 115° C. The reaction mixture gelled several minutes thereafter.

COMPARATIVE EXAMPLE 27

Melamine-Phenol-Formaldehyde Condensate (F/M= 3.0) Oxalic Acid at 115° C.

This example is similar to Example 26 (2533–37) except that a total of 151.2 g of 50% formalin (2.52 moles) was employed. After one-half of the formalin was added, the reaction was continued as follows: heat to 123° C. over 20 minutes to collect 26.4 g of distillate and maintain 123° (at reflux) for 2 hours. The temperature was lowered to 115° C. and the remainder of formalin was added over 30 minutes. Reflux temperature was now 109.7° C. 22 minutes later, the temperature was raised to 123° C. to collect 70.9 g distillate. This temperature was maintained for 2 hours prior to atmospheric distillation to 160° C., vacuum distillation of phenol, water sparge and vacuum drying. 351 g of product and 422 g of phenol were thus recovered. The importance of heating at the higher temperature (123° C.) after aldehyde addition is shown by the following. 15.5 g reaction mixture were removed and transferred to a large test tube immediately after the first one-half formalin was added. The test tube with stir bar was placed in a stirred oil bath at 115° C., allowed to equilibrate and 1.28 g of 50% formalin added (this affords a F/M of 3.0). Five minutes later the reaction gelled.

COMPARATIVE EXAMPLE 28

Melamine-Phenol-Formaldehyde Condensate

This example used the same quantities as the following example but at a higher temperature and only one half of the formalin was added at 123–125° C. over 53 minutes at which time 30.1 g distillate was collected. The distillate contained 0.1 g formaldehyde. The reaction mixture was heated 1 hour at 125° C. and then 40 g distillate collected by vacuum distillation at 105–125° C. The remainder of the formalin was added at 125° over 42 minutes at which time 36 g distillate was collected. The reaction mixture was heated an additional hour at 125° C. and then raised to 160° C. at which time 39.6 g distillate was collected. Product (347 g) and phenol (460 g) were recovered as previously described in Example 26. The solubilities and viscosities of the above mentioned examples illustrate the dramatic effect reaction temperature has on properties. Thus, the following Example 29 shows a high ratio of soluble to insoluble fraction as determined with the 90:10 methanol/water solubility test but In contrast the instant example with very high viscosity (greater than 8,100 cps at 175° C.) shows a solubility ratio of less than unity.

EXAMPLE 29

Melamine-Phenol-Formaldehyde Condensate (F/M= 3) Oxalic Acid Catalyst (0.2%)

A 1 liter flask was charged with 730.8 g phenol (7.76 moles), 105.8 g of melamine (0.84 mole) and 1.46 g oxalic acid dihydrate and heated under nitrogen to 80° C. Half of the formalin (75.76 g, 1.26 mole) was then added over 28 minutes. The temperature was then raised to 123° C. at which time 27.1 g distillate was collected. The reaction mixture was then heated for 2 hours at 123° C. and 17.8 g of distillate was removed, and then cooled to 80° C. The remaining half of the formalin (total of 149.7 g) was added over 32 minutes at 80° C. The reaction mixture was then heated to 123° C. at which time 67.0 g distillate was collected. The reaction mixture was then heated for 1 hour at 123° C., 2 hours at 140° C. and one hour at 160° C. while collecting 36.3 g distillate. Product (356.7 g) and phenol (432 g) were recovered as previously described in Example 26.

EXAMPLE 29A

Epoxidation of Example 29

A 2 liter flask was charged with 100 g melamine-phenol-formaldehyde condensate, 267 g isopropyl alcohol, and 518 g epichlorohydrin and stirred well to dissolve the condensate. Then 124.5 g water was added and the reaction mixture heated to 55° C. Over the course of 15 minutes, 40 g of 20% sodium hydroxide was added while maintaining a temperature of 55° C. After 30 minutes, 120 g of 20% sodium hydroxide was added over the course of one hour. Heating at 55° C. was continued for another 30 minutes whereupon 334 g ice water and 67 g dry ice were added. After mixing, the contents of the flask were transferred to a separatory funnel. The aqueous layer was drawn off and discarded. The organic layer was washed with ice water and dry ice as before. The washed organic layer was transferred in portions to a 500 ml flask for vacuum distillation at 56–60° C. 432.7 g of distillate was removed to leave 164.5 g of viscous material. 135 g of this material was dissolved in 100 mls (milliliters) of chloroform and 300 mls of hexanes gradually added with stirring to precipitate resin. The majority of liquor was decanted off and discarded. 100 g was evaporated to leave 1.9 g oily residue. The precipitate was re-dissolved in 80 mls of chloroform and re-precipitated with 200 mls of hexanes. After air drying for several hours at room temperature, the product was vacuum dried at 28–28.5 inches of mercury vacuum at room temperature for about 6 hours. Yield of whitish solid was 108 g with a 12.2% nitrogen content and a Mw/Mn of 329/243. At least 60% was soluble in Dowanol PM (1-methoxy-2-propanol), a product of Dow Chemical of Midland, Mich. and moderately soluble in THF (tetrahydrofuran), MEK, and acetone. The weight per epoxy equivalent (WPE) was 288. The ability of this product to crosslink was evident when a hot plate cure (171° C.) of 136 seconds was obtained using a 60% solution in Dowanol PM. Further drying of 11.5 g for 3 hours at 25° C. to 35° C. under 29.5 inches of mercury vacuum let to a loss of 0.5 g. This material had a WPE value of 342 and contained 12.6% nitrogen.

EXAMPLE 30

Preparation of Melamine-Phenol-Formaldehyde Condensate (F/M=2.5) With Formic Acid Catalyst (1% Based on Weight of Reaction Mixture)

A one liter flask was charged with 730.8 g of phenol (7.76 moles), 105.8 g of melamine (0.84 mole) and 8 g of 90% formic acid. The reaction mixture was heated under nitrogen to 100° C. and then 63 g of 50% formalin (1.05 moles) was added over 25 minutes. A total of 18.4 g reaction mixture was removed for other testing. The reaction mixture was heated to 123° C. while removing 1–2 mls of distillate. This temperature was maintained for 2 hours and then 12.6 g of the reaction mixture was removed for other testing. The temperature was reduced to 100° C. and 60.8 g of 50% formalin added over 20 minutes. After heating 30 minutes at 100° C. the temperature of the reaction mixture was raised to 160° C. over 80 minutes during which time 104 g distillate was collected. The distillate contained 0.67 g formic acid. The reaction mixture was maintained at 160° C. for 35 minutes. Product (311 g) and phenol (497 g) were recovered as in Example 3. Product is characterized in Table 3B.

In a similar manner to Example 30, one-half of the melamine may be substituted by an equal weight of benzoguanamine. In a similar manner to Example (Ex) 30 15 mole % of formaldehyde may be substituted by an equimolar amount of acetaldehyde.

When the earlier removed sample (18.4 g) of the above Example 30 was placed in an oil bath at 105° C. and requisite amount of formalin added (to give F/M=2.5) gelation occurred within several minutes. In a somewhat similar manner the formalin of first addition can be substituted by an equivalent of paraformaldehyde.

COMPARATIVE EXAMPLE 1

This repeats Manufacturing Example A in U.S. Pat. No. 5,955,184 but 0.3 mole (0.6 $NH_2$ equivalents) benzoguanamine was replaced with 0.2 mole (0.6 $NH_2$ equivalents) of melamine and the reaction product was dehydrated atmospherically (not vacuum as in Example A of the patent. The materials and procedure for conducting this Comparative Example were as follows:

| Materials | Grams | Moles |
|---|---|---|
| 1. Phenol | 367 | 3.9 |
| 2. 37% formalin | 300 | 3.7 |
| 3. Melamine | 25.2 | 0.2 |
| 4. Oxalic Acid-2$H_2O$ | 0.14 | — |

Procedure
1. Charge 1, 2, and 3 to flask.
2. At 45° C. add 4.
3. Hold for 2 hours at 80° C.
4. Atmospherically distill to 150° C. to collect 337 grams (g) (contains 71.1 g of formaldehyde).
5. Vacuum distill at about 180° C. gradually increasing vacuum to 28 inches.
6. Discharge product (158 g) and vacuum distillate (208 g).

COMPARATIVE EXAMPLE 2

In a similar manner to Comparative Example 1, oxalic acid was replaced by 1.06 g of triethylamine. 251 g atmospheric distillate was collected. However, gelation of product occurred at about 165° C. at 15 inches of vacuum at which time a small amount of phenol distillate was recovered.

COMPARATIVE EXAMPLE 3

In a manner similar to Comparative Example 1, except the reaction was dehydrated after 2 hours at about 80° C. under vacuum as follows: over 1.25 hours, heat at 70° C. to 850° C. increasing vacuum from 23.5 to 29 inches to collect 254 g of distillate containing 16.3 g of formaldehyde. Vacuum distillation was continued to about 180° C. to obtain product (117.2 g) and phenol vacuum distillate (283 g). 20.2 g of product was further heated in a vacuum oven for two hours at 180–190° C. under 29–29.25 inches of mercury vacuum.

COMPARATIVE EXAMPLE 4
(EXAMPLE 2 in EP 0877040 B1)

Example 2 in this EP publication was followed on a 5×scale (e.g., 5 moles of phenol were used). A 1 liter flask was charged with 470 g phenol (5 moles) 90 g of melamine (0.715 mole), 2 g of triethylamine, 225 g of 41.5% formalin (3.1 moles) and the temperature gradually increased to 100° C. The reaction mixture was maintained 5 hours at 100° C. and then raised to 120° over 2 hours while removing water under atmospheric pressure. The reaction mixture was maintained at 120° C. for 3 hours and then over 2 hours heated to 140° C. The reaction was maintained at 140 ° C. for 3 hours and then heated over 2 hours to 160° C. and then maintained at 160° C. for 3 hours. The temperature was raised to 180° C. over 2 hours and then phenol (136 g) was recovered by distillation at 180° C. under vacuum of 30 inches of mercury. Product (457.5 g) was discharged and is characterized as follows: Phenol of 0.76%; nitrogen of 14.96%; Mw/Mn of 817/367; viscosity at 175° C. of 2370 cps.

TABLE 4

Properties of the Comparative Examples

| Comparative Example | Phenol % | N % | Mw/Mn | Visc Cps (175° C.) |
|---|---|---|---|---|
| 1 | 0.34 | 10.45 | 2300/663 | 2340 |
| 2 | | | This material gelled. | |
| 3[a] | 0.97 | 14.3 | 2856/571 | 5265 |
| 4[b] | 0.76 | 14.96 | 817/367 | 2370 |

[a]post vacuum treated material insoluble in acetone, THF, methanol and slightly swollen by NMP (N-methyl pyrrolidone).
[b]European patent 877,040 of Nov. 11, 1998 to Dainippon Ink and Chemicals Ex 2.

From the results in Table 4 and Tables 1A and B and 2A and B, and the following Table 5, it can be seen that the Comparative examples provide lower nitrogen contents (up to 8% lower), considerably lower soluble/insoluble ratios as determined in 90:10 methanol/water method at 25° C., and with few exceptions (weak to moderate amine catalysts with no post formic acid) considerably higher viscosities.

TABLE 5

Triazine-Phenol-Formaldehyde Condensates Solubility Table

| | Solubility in 90:10 MeOH/H₂O | | Solubility 50%; Y = yes; N = no | |
|---|---|---|---|---|
| Ex | Solubility, g | Insolubility, g | MEK | Dowanol PM |
| Control *SD-1732 | 5.10 | 0.00 | Y | Y |
| Control SD-1732 + 0.5 g melamine | 5.51 | 0.51 | — | — |
| Comp. Ex 1 | 2.62 | 5.84 | Y | Y |
| Comp. Ex 3 | 0.30[a] | Very High | Y | Y |
| Comp. Ex 4 | 4.09 | 2.90 | Y | Y |
| 2 | 4.36 | 1.51 | Y | Y |
| 5 | 5.00 | nil | — | — |
| 15 | 4.97 | 0.13 | Y | Y |
| 17 | 4.64 | 1.08 | — | Y |
| 17A | 2.23 | 5.91 | Y | Y |
| 18 | — | — | N | N |

TABLE 5-continued

Triazine-Phenol-Formaldehyde Condensates Solubility Table

| | Solubility in 90:10 MeOH/H₂O | | Solubility 50%; Y = yes; N = no | |
|---|---|---|---|---|
| Ex | Solubility, g | Insolubility, g | MEK | Dowanol PM |
| 18A | 5.21 | 0.79 | N | N |
| 21B | 5.09 | 0.03 | — | — |
| 21C | 4.95 | 0.57 | N | Y |
| 23 | 5.06 | 0.07 | N | Y |
| 24 | 4.80 | 0.30 | — | — |
| 25 | 5.00 | 1.77 | Y | Y |
| 26 | 4.90 | 0.55 | Y | Y |
| 27 | 3.89 | 2.92 | Y | Y |
| 28 | 3.51 | 4.48 | Y | Y |
| 29 | 4.94 | 0.76 | Y | Y |
| 30 | 4.84 | 1.01 | Y | Y |

[a]A pasty mix resulted after addition of 3.0 g water which then showed very little settling after 2 days standing. Sample centrifuged and removed 6 g clear solution which was then dried. Value shown is calculated on a 20 g basis.
*Durite SD-1732, or simply SD-1732 is a product to Borden Chemical, Inc. of Columbus, Ohio and specifically, a phenol formaldehyde novolac with a molecular weight of about 1,000 and a viscosity of about 340 cps at 150° C. with a maximum free phenol content of 0.1%

From solubility Table 5, it can be seen that comparative Examples 1, 3 and 4 although showing 50% solubility in MEK and Dowanol PM, exhibit limited to very poor solubility by the 90:10 methanol/water method at 25° C. The same is true for comparative Examples 27 and 28 (i.e., soluble/insoluble fraction ratios of 1.4 and much lower). Examples 26 (which is slightly above the temperature limitations of the method involved) and 29 in which an oxalic acid catalyst had ratios of at least 7.6 is significantly higher than Comparative Examples 1 and 3 which are also oxalic acid catalyzed. Examples 2, 15, 17, 21B, 21C, 23, 24, 25 and Comparative Example 4 all use triethylamine catalyst. However, Example 29 has a ratio of 6.5 vs. the 1.4 for Comparative Example 4. The criticality of reaction parameters is shown by Example 29 in relation to Comparative Examples 27 and 28, all three using oxalic acid catalyst at a F/M mole ratio of 3.0. Soluble/insoluble fraction ratios being 6.5, 1.3 and 0.78, respectively. One conclusion to be drawn from solubilities is the large discrepancy in soluble/insoluble fraction of the examples of this invention vs. Comparative Examples must be due to differences in molecular structure, particularly since, with few exceptions, the condensates are soluble (50%) in both MEK and Dowanol PM.

TABLE 6

Part C
Effect on Viscosity on Blending Triazines with Melamine-Phenol-Formaldehyde Condensate of Example 21C.

| | Viscosity, cps | |
|---|---|---|
| Additive[a] (%) | At 150° C. | At 175° C. |
| None | 4540 | 490 |
| Benzoguanamine (2) | 3750 | 386 |
| Benzoguanamine (5) | 3550 | 345 |
| Benzoguanamine (20) | 1975 | 202 |
| Acetoguanamine (2) | 3831 | 400 |
| Acetoguanamine (5) | 3792 | 384 |
| Acetoguanamine (20) | 3357 | 300 |
| Melamine (5) | — | 575 |

[a]% by weight on the condensate.

The results of the above Table 6 shows that both acetoguanamine and particularly benzoguanamine reduce viscosity with increased levels of acetoguanamine and benzoguanamine causing a further reduction in viscosity. This is in contrast with addition of melamine which has the opposite effect, i.e., it increases viscosity. Substitution of other T-P-A condensates such as that of U.S. Pat. Nos. 5,955,184, 2,328,592, or EP 877040 in place of the T-P-A condensate of this invention will also lead to significant reduction in viscosity.

Epoxy Formulation & Laminates

Melamine-phenol-formaldehyde condensates, epoxy curing agents and a phenol-formaldehyde novolac were formulated with non-halogenated epoxy resin D.E. R. 383 (Dow Chemical of Midland, Mich.) as shown in Table 7 below. All quantities are in grams.

TABLE 7

Epoxy Formulations for Laminates

| Mix | D.E.R383 (Quantity) | Curing[a] Agent (Quantity) | 2-MI[b] (Quantity) | TPP[c] (Quantity) | $H_3PO_4$[d] (Quantity) |
|---|---|---|---|---|---|
| 1 | 25.0 | Durite SD-1732 26.3 | 1 | | |
| 2 | 25.0 | Ex 17, 26.3 | 1 | | |
| 3 | 25.0 | Ex 25, 26.3 | 1 | | |
| 4 | 25.0 | Ex 17, 26.3 | | | 2.75 |

[a]As 50% in Dowanol PM, except for Durite SD-1732, a product of Borden Chemical, Inc. (50%) in MEK)
[b]2-Methyl imidazole catalyst as 5% in Dowanol PM.
[c]Triphenylphosphine catalyst as 5% in Dowanol PM.
[d]Phosphorus acid (0.75 g) as 27.3% in methanol.

25.2 g of the various mixes shown in the above Table 7 were used to coat glass cloth having dimensions of 9.5×9.5 inches. The coating was then placed in an oven at 155° C. for 2 minutes. Four pieces of 3.75×2.75 inches were cut and assembled into a sandwich and cured under a 2 kg weight for 1.5 hours at 171° C. The resulting laminate was cut into pieces of 9/16 inch widths which were tested for fire-retardancy. The fire-retardancy test was performed as follows. One half inch end of laminate was placed over a flame from a micro bunsen burner (Preiser Scientific, Louisville, Ky.). The inner burner flame was 2.25 inches high and the vertical distance from the top of the burner barrel to the sample was 5.25 inches. The sample was removed from the flame after it fully ignited and the time to self extinguish was recorded. The following Table 8 shows the results of this fire-retardance test.

TABLE 8

Fire-Retardancy

| Laminate from Mix | Time in Seconds to | |
|---|---|---|
| | Fully ignite | Self extinguish |
| 1 | 14 | 48 |
| 2 | 13 | 24 |
| 3 | 12 | 39 |
| 4 | 14 | 13 |

The results in the above Table 8 on fire-retardancy show that non-halogenated epoxy laminates prepared from melamine-phenol-formaldehyde condensate curing agents of this invention show greater fire-retardance than a phenol formaldehyde novolac curing agent and that incorporation of phosphorus containing material further enhances fire-retardance (compare mix 4 versus mix 2). In somewhat similar manner to Mix 2 one-half of Ex. 17 condensate can be replaced by one-half of Durite SD 1732 to give a laminate with improved fire-retardancy compared to mix 1.

Table 9

Percent of Phenol Reacted

The following Table 9 shows the percent of phenol which was actually reacted, relative to moles of aldehyde added, in the indicated examples. The zero ("0") hour reading was taken immediately after the reaction mixture reached the temperature indicated in Table 9 below, e.g., 1 hour is measured from zero hour. The temperature (Temp) of the reaction mixture at the time the readings were made is also provided. The letter in parenthesis preceding each "% Phenol Reacted" reading corresponds with the same letter for the "Hours/Temp" reading for the same example in the row involved.

TABLE 9

| Example | Hours/Temp. in ° C. | % Phenol Reacted |
|---|---|---|
| 20 | (a) 2/70; (b) 1/100 | (a) 35.08; (b) 61.6 |
| 21A | (a) 1.5/110; (b)2.5/110; (c)4/110 | (a) 65; (b) 73; (c) 80 |
| 22 | (a) 0/100 (b) 1/100; (c) 3/100; (d) 4/100 | (a) 47.9; (b) 65.72; (c) 78.51; (d) 80.66 |
| 23 | (a) 0/115; (b) 1/115; (c) 2/115; (d) 3/115; (e) 4/115 | (a) 50.5; (b) 67.4; (c) 84.1 (d) 90.1; (e) 95.3 |
| 24 | (a) 0/115; (b) 1.5/115; (c) 2.75/115; (d) 4/115 | (a) 31.36; (b) 65.31 (c) 71/.1 (d) 84.1 |
| 26 | (a) 0/123; (b) 1/123; (c) 2/123 | (a) 57.75; (b) 61.11; (c) 85.42 |

It can be seen from the above Table 9 that in Examples 22–26 only about 31–58% of theoretical phenol has reacted immediately after reaction of formaldehyde is essentially complete. Higher temperatures, i.e. about 115° C. to 123° C. for several hours are required to attain phenol conversion of at least about 85%.

pH Of Reaction Mixtures

A stock solution was prepared from 150 g phenol, 10 g of de-ionized water, and 29.3 g of formalin containing 52.23% formaldehyde and 0.03% formic acid by weight. 50 g aliquots were treated with the following acids and the pH determined at about 25° C. The results of this experiment are shown in Table 10 below.

TABLE 10 pH of Reaction Mixtures

| Mix | Acid | pH |
|---|---|---|
| 1 | 0.25 g oxalic acid.$2H_2O$ | 0.45 (6.34)[b] |
| 2 | 0.50 g of 50% formic acid | 1.65 (1.71)[a], (5.81)[a][b], (490)[a][b][c] |
| 3 | 0 55 g of 90% formic acid | 0.95 |

[a]After addition of 13 g of stock solution.
[b]Several minutes after addition of 7.2 g of melamine.
[c]After addition of 0.50 g of 90% formic acid.

It was observed that Mix 2 with melamine is essentially homogeneous, i.e., the melamine had reacted, after 30 minutes at room temperature whereas Mix 1 was still heterogeneous after 2.5 hours.

Mix 2 with added stock solution, formic acid, and melamine simulates and is about equivalent to 1% formic acid catalyst on phenol weight and F/M molar ratio of 3.0. Addition of more acid would further decrease the pH.

What is claimed is:

1. A condensation product of a triazine, a phenol, and an aldehyde said condensation product being substantially free of water and having from about 15% to 24% nitrogen, a melt viscosity of not more than about 2,000 cps at 175° C., not more than 2% of free phenol and a solubility of at least 80% by a 90:10, by weight, methanol:water solvent method at 25° C. wherein the triazine is a member selected from the group consisting of: (a) melamine; (b) a mixture of at least 50% melamine and from about 0.5% to not more than about 50% benzoguanamine; (c) a mixture of at least 50% melamine and from about 0.5% to not more than 50% acetoguanamine; and (d) a mixture of at least 50% melamine, not more than 35% each of benzoguanamine and acetoguanamine, all of said percentages being by weight.

2. The product of claim 1 which contains from about 17% to 22% of nitrogen and has a melt viscosity of not more than about 1,000 cps at 175° C.

3. The product of claim 1 wherein:

(A) the triazine is the residue of a member selected from the group consisting of: melamine; a mixture of at least 75% by weight of melamine and not more than 25% by weight of benzoguanamine; a mixture of at least 75% by weight of melamine and not more than 25% by weight of acetoguanamine; and a mixture of at least 75% by weight of melamine with the remainder being a mixture of benzoguanamine and acetoguanamine;

(B) the phenol is a member selected from the group consisting of the residue of: phenol itself; a meta-substituted alkyl phenol having from 1 to 4 carbon atoms in the alkyl group; a meta-substituted alkoxy phenol having from 1 to 4 carbon atoms in the alkoxy group; and a mixture of phenol itself and said meta-substituted alkyl phenol and meta-substituted alkoxy phenol wherein the phenol itself is at least 90% by weight of the mixture; and (C) the aldehyde is a member selected from the group consisting of: the residue of formaldehyde; the residue of a mixture of formaldehyde and acetaldehyde wherein the formaldehyde is at least 80 molar percent of the mixture; the residue of a mixture of formaldehyde and benzaldehyde wherein the formaldehyde is at least 80 molar percent of the mixture; the residue of a mixture of formaldehyde and isobutyraldehyde wherein the formaldehyde is at least 80 molar percent of the mixture; the residue of a mixture of formaldehyde and crotonaldehyde wherein the formaldehyde is at least 80 molar percent of the mixture; the residue of a mixture of formaldehyde and acrolein wherein the formaldehyde is at least 80 molar percent of the mixture; and the residue of a mixture of formaldehyde, acetaldehyde, isobutyraldehyde, benzaldehyde, crotonaldehyde, and acrolein wherein the formaldehyde is at least 80 molar percent of the mixture.

4. The product of claim 1 wherein the condensate has incorporated therein from about 52% to 67%, by weight, of phenolic residue.

5. The product of claim 1 wherein the triazine is melamine, the phenol is phenol itself, and the aldehyde is formaldehyde.

6. A flame-retardant epoxy resin composition comprising:

(A) an epoxy resin;

(B) a triazine-phenol-aldehyde condensate, said condensate being substantially free of water and having from about 15% to 24% nitrogen, not more than 2% of free phenol, a melt viscosity of not more than 2,000 cps at 175° C. and a solubility of at least 80% by a 90:10, by weight, methanol:water method at 25° C. wherein the triazine is a member selected from the group consisting of: (a) melamine; (b) a mixture of at least 50% melamine and from about 0.5% to not more than about 50% benzoguanamine; (c) a mixture of at least 50% melamine and from about 0.5% to not more than about 50% acetoguanamine; and (d) a mixture of at least 50% melamine and not more than 35% each of benzoguanamine and acetoguanamine, all of said percentages being by weight; and (C) a curing accelerator.

7. The composition of claim 6 wherein the triazine is melamine, the phenol is phenol itself, the aldehyde is formaldehyde and the viscosity is not more than 1,000 cps at 175° C.

8. A prepreg comprising a porous substrate impregnated with the epoxy resin composition of claim 6.

9. A laminate comprising a plurality of prepregs according to claim 8 laminated together wherein said epoxy resin composition is cured.

10. The laminate of claim 9 wherein:

(A) the triazine is the residue of a member selected from the group consisting of: melamine; a mixture of at least 75% by weight of melamine and not more than 25% by weight of benzoguanamine; a mixture of at least 75% by weight of melamine and not more than 25% by weight of acetoguanamine; and a mixture of at least 75% by weight of melamine with the remainder being a mixture of benzoguanamine and acetoguanamine;

(B) the phenol is a member selected from the group consisting of the residue of: phenol itself; a meta-substituted alkyl phenol having from 1 to 4 carbon atoms in the alkyl group; a meta-substituted alkoxy phenol having from 1 to 4 carbon atoms in the alkoxy group; and a mixture of phenol itself and said meta-substituted alkyl phenol and meta-substituted alkoxy phenol wherein the phenol itself is at least 90% by weight of the mixture; and (C) the aldehyde is a member selected from the group consisting of the residue of: formaldehyde; the residue of a mixture of formaldehyde and acetaldehyde wherein the formaldehyde is at least 80 molar percent of the mixture; the residue of a mixture of formaldehyde and benzaldehyde wherein the formaldehyde is at least 80 molar percent of the mixture; the residue of a mixture of formaldehyde and isobutyraldehyde wherein the formaldehyde is at least 80 molar percent of the mixture; the residue of a mixture of formaldehyde and crotonaldehyde wherein the formaldehyde is at least 80 molar percent of the mixture; the residue of a mixture of formaldehyde and acrolein wherein the formaldehyde is at least 80 molar percent of the mixture; and the residue of a mixture of formaldehyde, acetaldehyde, isobutyraldehyde, benzaldehyde, crotonaldehyde, and acrolein wherein the formaldehyde is at least 80 molar percent of the mixture.

11. The laminate of claim 9 wherein the condensate has incorporated therein from about 52% to 67%, by weight, of phenolic residue.

12. The laminate of claim 9 wherein the triazine is melamine, the phenol is phenol itself, and the aldehyde is formaldehyde.

13. The laminate of claim 9 wherein the triazine is melamine and the aldehyde is formaldehyde.

14. The composition of claim 6 wherein said composition is halogen-free.

15. The composition of claim 6, wherein the nitrogen content of the condensate is from about 17% to 23%.

16. A glycidylated triazine-phenol-aldehyde condensate, said condensate prior to glycidylation, being substantially free of water and having from about 15% to 24% of nitrogen, not more than about 2% of free phenol, a melt viscosity of not more than 2,000 cps at 175° C. and a solubility of at least 80% by a 90:10, by weight, methanol:water solvent method at 25° C. wherein the triazine is a member selected from the group consisting of: (a) melamine; (b) a mixture of at least 50% melamine and from about 0.5% to not more than about 50% benzoguanamine; (c) a mixture of at least 50% melamine and from about 0.5% to not more than about 50% acetoguanamine; and (d) a mixture of at least 50% melamine and not more than 35% each of benzoguanamine and acetoguanamine, all of said percentages being by weight.

17. The glycidylated triazine-phenol-aldehyde condensate of claim 16 wherein the condensate prior to glycidylation comprises:

(A) a triazine residue wherein said residue is selected from the group consisting of the residue of: melamine; a mixture of at least 75% by weight of melamine and not more than 25% by weight of benzoguanamine; a mixture of at least 75% by weight of melamine and not more than 25% by weight of acetoguanamine; and a mixture of at least 75% by weight of melamine with the remainder being a mixture of benzoguanamine and acetoguanamine;

(B) a phenol residue wherein said residue is selected from the group consisting of the residue of: phenol itself; a meta-substituted alkyl phenol having from 1 to 4 carbon atoms in the alkyl group; a meta-substituted alkoxy phenol having from 1 to 4 carbon atoms in the alkoxy group; and a mixture of phenol itself and said meta-substituted alkyl phenol and meta-substituted alkoxy phenol wherein the phenol itself is at least 90% by weight of the mixture; and (C) an aldehyde residue wherein said residue is selected from the group consisting of: the residue of formaldehyde; the residue of a mixture of formaldehyde and acetaldehyde wherein the formaldehyde is at least 80 molar percent of the mixture; the residue of a mixture of formaldehyde and benzaldehyde wherein the formaldehyde is at least 80 molar percent of the mixture; the residue of a mixture of formaldehyde and isobutyraldehyde wherein the formaldehyde is at least 80 molar percent of the mixture; the residue of a mixture of formaldehyde and crotonaldehyde wherein the formaldehyde is at least 80 molar percent of the mixture; the residue of a mixture of formaldehyde and acrolein wherein the formaldehyde is at least 80 molar percent of the mixture; and the residue of a mixture of formaldehyde, acetaldehyde, isobutyraldehyde, benzaldehyde, crotonaldehyde, and acrolein wherein the formaldehyde is at least 80 molar percent of the mixture.

18. A composition suitable for electronic applications comprising an epoxy resin wherein for each 100 parts of epoxy resin the composition contains:

(a) about 0–30 parts of a phenolic-formaldehyde novolac;

(b) optionally an epoxy curing accelerator; and (c) about 30 to 60 parts of a triazine-phenol-aldehyde condensation product, said condensation product being substantially free of water and having from about 15% to 24% nitrogen, a melt viscosity of not more than about 2,000 cps at 175° C., not more than 2% of free phenol and a solubility of at least 80% by a 90:10, by weight, methanol:water solvent method at 25° C. wherein the triazine is a member selected from the group consisting of: (a) melamine; (b) a mixture of at least 50% melamine and from about 0.5% to not more than about 50% benzoguanamine; (c) a mixture of at least 50% melamine and from about 0.5% to not more than about 50% acetoguanamine; and (d) a mixture of at least 50% melamine and not more than 35% each of benzoguanamine and acetoguanamine, all of said parts and percentages being by weight.

19. The composition of claim 18, wherein said condensation product contains from about 17% to 22% of nitrogen and has a melt viscosity of not more than about 1,000 cps at 175° C.

20. The composition of claim 18 wherein:

(A) the triazine is the residue of a member selected from the group consisting of: melamine; a mixture of at least 75% by weight of melamine and not more than 25% by weight of benzoguanamine; a mixture of at least 75% by weight of melamine and not more than 25% by weight of acetoguanamine; and a mixture of at least 75% by weight of melamine with the remainder being a mixture of benzoguanamine and acetoguanamine;

(B) the phenol is the residue of a member selected from the group consisting of: phenol itself; a meta-substituted alkyl phenol having from 1 to 4 carbon atoms in the alkyl group; a meta-substituted alkoxy phenol having from 1 to 4 carbon atoms in the alkoxy group; and a mixture of phenol itself and said meta-substituted alkyl phenol and meta-substituted alkoxy phenol wherein the phenol itself is at least 90% by weight of the mixture; and (C) the aldehyde is a member selected from the group consisting of: the residue of formaldehyde; the residue of a mixture of formaldehyde and acetaldehyde wherein the formaldehyde is at least 80 molar percent of the mixture; the residue of a mixture of formaldehyde and benzaldehyde wherein the formaldehyde is at least 80 molar percent of the mixture; the residue of a mixture of formaldehyde and isobutyraldehyde wherein the formaldehyde is at least 80 molar percent of the mixture; the residue of a mixture of formaldehyde and crotonaldehyde wherein the formaldehyde is at least 80 molar percent of the mixture; the residue of a mixture of formaldehyde and acrolein wherein the formaldehyde is at least 80 molar percent of the mixture; and the residue of a mixture of formaldehyde, acetaldehyde, isobutyraldehyde, benzaldehyde, crotonaldehyde, and acrolein wherein the formaldehyde is at least 80 molar percent of the mixture.

21. The composition of claim 18, wherein the condensation product has incorporated therein from about 52% to 67%, by weight, of phenolic residue.

22. The composition of claim 18 wherein the triazine is melamine, the phenol is phenol itself, and the aldehyde is formaldehyde.

23. A flame-retardant epoxy resin composition comprising:

(A) an epoxy resin;

(B) a triazine-phenol-aldehyde condensate, said condensate being substantially free of water and having from about 15% to 24% nitrogen, not more than 2% of free phenol, a melt viscosity of not more than 2,000 cps at 175° C. and a solubility of least 80% by a 90:10, by weight, methanol:water method at 25° C. wherein the triazine is a member selected from-the group consisting of: (a) melamine; (b) a mixture of at least 50% melamine and from about 0.5% to not more than about 50% benzoguanamine; (c) a mixture of at least 50% melamine and from about 0.5% to not more than about 50% acetoguanamine; and (d) a mixture of at least 50% melamine and not more than 35% each of benzoguanamine and acetoguanamine, all of said percentages being by weight;

(C) a curing accelerator; and (D) a phenolic-formaldehyde novolac a curing agent.

24. The composition of claim 23 wherein the triazine is melamine, the phenol is phenol itself, and the aldehyde is formaldehyde.

25. The composition of claim 24 wherein the viscosity is not more than 1,000 cps at 175° C.

26. A flame-retardant epoxy resin composition comprising:

(A) an epoxy resin;

(B) a triazine-phenol-aldehyde condensate, said condensate being substantially free of water and having from about 15% to 24% nitrogen, not more than 2% of free phenol, a melt viscosity of not more than 2,000 cps at 175° C. and at least 80% solubility in a water and methanol mixture at 25° C., wherein said mixture has a weight ratio of 90:10 of methanol:water wherein the triazine is a member selected from the group consisting of: (a) melamine; (b) a mixture of at least 50% melamine and from about 0.5% to not more than about 50% benzoguanamine; (c) a mixture of at least 50% melamine and from about 0.5% to not more than about 50% acetoguanamine; and (d) a mixture of at least 50% melamine and not more than 35% each of benzoguanamine and acetoguanamine, all of said percentages being by weight;

(C) a curing accelerator; and (D) a member selected from the group consisting of benzoguanamine, acetoguanamine and mixtures thereof in a quantity of about 0.5% to 20% by weight of the condensate.

27. The composition of claim 26 wherein the triazine is melamine, the phenol is phenol itself, the aldehyde is formaldehyde and the viscosity is not more than 1,000 cps at 175° C.

* * * * *